United States Patent

Shimba et al.

(10) Patent No.: US 8,247,338 B2
(45) Date of Patent: *Aug. 21, 2012

(54) HIGH DIELECTRIC CONSTANT PASTE COMPOSITION AND DIELECTRIC COMPOSITION USING THE SAME

(75) Inventors: Yoichi Shimba, Otsu (JP); Yoshitake Hara, Otsu (JP); Tsukuru Mizuguchi, Otsu (JP); Toshihisa Nonaka, Otsu (JP)

(73) Assignee: Toray Industries, Inc (JP)

( * ) Notice: Subject to any disclaimer, the term of this patent is extended or adjusted under 35 U.S.C. 154(b) by 134 days.

This patent is subject to a terminal disclaimer.

(21) Appl. No.: 12/863,305

(22) PCT Filed: Jan. 14, 2009

(86) PCT No.: PCT/JP2009/050332
§ 371 (c)(1),
(2), (4) Date: Jul. 16, 2010

(87) PCT Pub. No.: WO2009/090943
PCT Pub. Date: Jul. 23, 2009

(65) Prior Publication Data
US 2011/0053759 A1    Mar. 3, 2011

(30) Foreign Application Priority Data
Jan. 18, 2008   (JP) .................................. 2008-008798

(51) Int. Cl.
*C04B 35/00* (2006.01)
*C08K 3/22* (2006.01)
*H01G 4/10* (2006.01)

(52) U.S. Cl. ........ 501/134; 524/413; 524/436; 524/783; 501/135; 501/136; 501/137; 361/321.5

(58) Field of Classification Search .................. 501/134, 501/135, 136, 137; 524/413, 436, 783; 361/321.5
See application file for complete search history.

(56) References Cited

U.S. PATENT DOCUMENTS

| | | | |
|---|---|---|---|
| 4,948,700 A * | 8/1990 | Maeda et al. .............. | 430/280.1 |
| 6,183,669 B1 * | 2/2001 | Kubota et al. .............. | 156/89.16 |
| 7,060,411 B2 * | 6/2006 | Mitsui et al. ................. | 430/198 |
| 7,960,462 B2 * | 6/2011 | Shinba et al. ................. | 524/423 |
| 2003/0129546 A1 * | 7/2003 | Mitsui et al. ................. | 430/320 |
| 2009/0078747 A1 * | 3/2009 | Park et al. ..................... | 228/249 |
| 2009/0270541 A1 * | 10/2009 | Shinba et al. ................. | 524/423 |
| 2011/0014448 A1 * | 1/2011 | Hara et al. ..................... | 428/220 |
| 2011/0053759 A1 * | 3/2011 | Shimba et al. ............... | 501/136 |

FOREIGN PATENT DOCUMENTS

| | | |
|---|---|---|
| EP | 1612810 A1 | 1/2006 |
| EP | 1 788 412 A1 | 5/2007 |
| JP | 2003-146992 | 5/2003 |
| JP | 2005-38821 | 2/2005 |
| JP | 2006-309202 | 11/2006 |
| JP | 2009/7558 A | 1/2009 |
| WO | WO 2004/102589 A1 | 11/2004 |
| WO | WO 2006/098075 A1 | 9/2006 |
| WO | WO 2007/029605 A1 | 3/2007 |
| WO | WO 2008/056639 A1 | 5/2008 |

OTHER PUBLICATIONS

Scifinder substructure search for the claimed monomer. Search performed on Jan. 19, 2012.*
Scifinder substructure search for the claimed monomer, narrowed by term "dielectric". Search performed on May 1, 2012.*
Scifinder substructure search for claimed monomer narrowed by term "perovskite". Search performed on May 1, 2012.*
Scifinder substructure search for the claimed monomer narrowed by term "paste". Search performed on May 1, 2012.*
International Search Report dated Apr. 28, 2009, application No. PCT/JP2009/050332.

* cited by examiner

*Primary Examiner* — Liam Heincer
*Assistant Examiner* — Michael A Salvitti
(74) *Attorney, Agent, or Firm* — RatnerPrestia

(57) ABSTRACT

The present invention relates to a high dielectric constant paste composition comprising (A) inorganic particles having a perovskite crystal structure or a complex perovskite crystal structure, (B) a compound represented by any one of the general formulas (1) to (4) shown below, and (C) an organic solvent. The present invention provides a high dielectric constant paste composition for producing a high dielectric constant dielectric composition which has high insulation reliability and exhibits satisfactory resistance in a high-temperature high-humidity bias test.

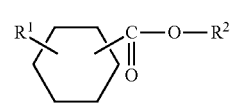

(1)

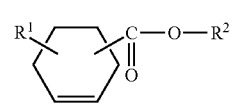

(2)

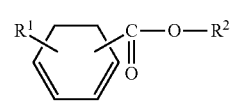

(3)

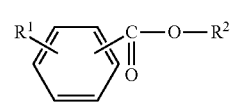

(4)

14 Claims, No Drawings

HIGH DIELECTRIC CONSTANT PASTE COMPOSITION AND DIELECTRIC COMPOSITION USING THE SAME

FIELD OF THE INVENTION

The present invention relates to a high dielectric constant paste composition for forming an interlayer insulating film for a capacitor, which is embedded in a mounted substrate for a semiconductor device, a wafer level package and a passive component part.

BACKGROUND OF THE INVENTION

Densification of mounting of modules and packages has been progressed so as to realize miniaturization, weight saving and cost reduction of electronic equipments. As one of methods of high density mounting, there is exemplified a method of incorporating passive component parts such as a capacitor into a module substrate, into a mounted substrate, or on a semiconductor wafer after producing a transistor. Since electrostatic capacity of a capacitor is in proportion to a dielectric constant of an interlayer insulating film, formation of an interlayer insulating film having a large dielectric constant is advantageous to realizing a large capacity. There has hitherto been known a method in which an interlayer insulating film having a high dielectric constant is obtained by coating, drying and curing a paste composition prepared by dispersing high dielectric constant particles in a resin (see Patent Document 1). There is also known a technique in which a capacitor is produced by forming a pattern of an interlayer insulating film by a photolithography method using a composition prepared by imparting photosensitivity to polyimide having high heat resistance and dispersing high dielectric constant particles therein (see Patent Document 2).

In these prior arts, in order to stably disperse particles in a paste, an organic substance called a dispersing agent having a functional group at ends is added and the functional group of the dispersing agent is coordinated on a surface of particles thereby inhibiting approach of particles, and thus reaggregation of particles is suppressed and dispersibility of particles is improved. However, it is very difficult to completely prevent aggregation of fine particle having an average particle diameter of several tens to several hundreds of nanometer and to maintain a satisfactory dispersion state. With a conventionally known dispersing agent, insulating characteristics might deteriorate in a dielectric composition such as an interlayer insulating film obtained by curing the paste composition. Also, insulation reliability in a test of evaluating insulating characteristics by applying a voltage to a dielectric composition in a high-temperature high-humidity environment (for example, 85° C., 85% RH) (high-temperature high-humidity bias test) might be insufficient.

It was difficult for the capacitor including an interlayer insulating film made of such a material to achieve high reliability because of unstable various physical properties.

Patent Document 1: Japanese Unexamined Patent Publication (Kokai) No. 2005-38821 (patent claims)
Patent Document 2: Japanese Unexamined Patent Publication (Kokai) No. 2006-309202 (patent claims)

SUMMARY OF THE INVENTION

Under these circumstances, the present invention provides a high dielectric constant dielectric composition, which has high insulation reliability and exhibits satisfactory resistance in a high-temperature high-humidity bias test. The present invention also provides a paste composition containing high dielectric constant fine particles for preparing such a dielectric composition.

Thus, the present invention provides a high dielectric constant paste composition comprising (A) inorganic particles having a perovskite crystal structure or a complex perovskite crystal structure, (B) a compound represented by any one of the general formulas (1) to (4) shown below, and (C) an organic solvent;

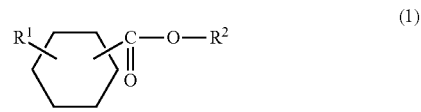

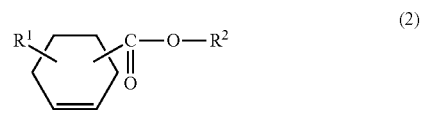

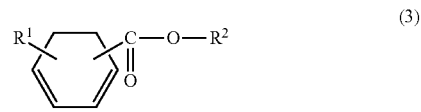

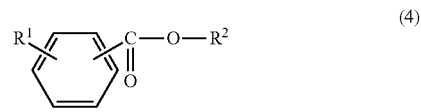

in the general formulas (1) to (4) show above, $R^1$ represents a monovalent group having a polymerizable group, $R^2$ represents a hydrogen atom or a monovalent group represented by the general formula (5) shown below; and

in the general formula (5) shown above, m is an integer of 1 to 3.

The present invention also provides a dielectric composition obtained by curing the paste composition.

By curing the high dielectric constant paste composition in an embodiment of the present invention, a dielectric composition having a high dielectric constant can be prepared. The resultant dielectric composition has excellent insulation reliability and exhibits satisfactory resistance in a high-temperature high-humidity bias test. A substrate embedded capacitor having high reliability can be produced by using the dielectric composition in an embodiment of the present invention.

DETAILED DESCRIPTION OF THE INVENTION

The high dielectric constant paste composition in an embodiment of the present invention (hereinafter referred to as a paste composition) includes (A) inorganic particles having a perovskite crystal structure or a complex perovskite crystal structure (hereinafter referred simply to as "inorganic particles"), (B) a compound represented by any one of the general formulas (1) to (4) shown below, and (C) an organic solvent.

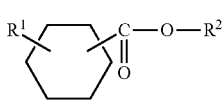

(1)

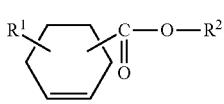

(2)

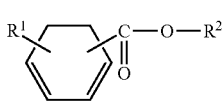

(3)

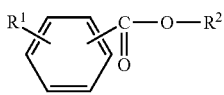

(4)

In the above general formulas (1) to (4), $R^1$ represents a monovalent group having a polymerizable group. $R^2$ represents a hydrogen atom or a monovalent group represented by general formula (5) shown below:

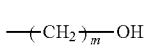

(5)

in the general formula (5), m is an integer of 1 to 3.

Hereinafter, the compound (B) is referred to as a "compound A" unless otherwise specified. In the paste composition in an embodiment of the present invention, the compound A has a function of dispersing inorganic particles. It is considered that the moiety sandwiched between $R^1$ and $R^2$ in the general formulas (1) to (4), which represent a structure of the compound A, interacts with inorganic particles thereby coating a surface of inorganic particles with the compound A. It is also considered that, in the compound A with which the surface of inorganic particles is coated, a polymerizable group faces outwardly of inorganic particles and shows affinity with organic solvent and other compounds in the paste composition thereby stably dispersing inorganic particles.

The polymerizable group in the compound A is an organic group capable of promoting polymerization of the polyaddition reaction or polycondensation reaction under light or heat. In the paste composition in an embodiment of the present invention, since the compound A takes part in polymerization, curing proceeds immediately and surely. The cured paste composition according to one aspect of the present invention is called a dielectric composition.

In an embodiment of the present invention, the compound A per se is polymerized by light or heat thereby being converted into a matrix resin in the dielectric composition. Therefore, the compound A has both a function as the dispersing agent of inorganic particles and a function as the matrix resin. It is considered when inorganic particles are dispersed in the matrix resin by a conventional dispersing agent having no polymerizable group, inorganic particles move and aggregate when the matrix resin is cured and shrunk by elimination of an organic solvent and polymerization of the matrix resin, resulting in formation of voids between the resin and particles. It is considered that existence of voids not only drastically disturbs realization of a high dielectric constant, but also causes deterioration of insulating characteristics such as increase in leak current and decrease in withstanding voltage. It is also considered that insulation reliability deteriorates by passing moisture through voids in a test in which insulating characteristics are evaluated by applying a voltage to a dielectric composition in a high-temperature high-humidity environment (for example, 85° C., 85% RH) (high-temperature high-humidity bias test).

In contrast, in the paste composition in an embodiment of the present invention, since the compound A is polymerized in the state of trapping inorganic particles, dispersibility of inorganic particles can be satisfactorily maintained even in the dielectric composition after curing. Therefore, voids caused by aggregation of particles existing in the dielectric composition decrease. Furthermore, since heat resistance is improved by polymerizing the compound A and decomposition and elimination are less likely occur during a heat treatment in the production of the dielectric composition or in the process after production, voids in the dielectric composition can be more decreased. Therefore, it is possible to realize a dielectric composition which shows a very small leak current and has satisfactory insulation reliability. Particularly in a high-temperature high-humidity environment, since it is possible to reduce ion migration caused by permeation of water into the composition through voids in the dielectric composition, satisfactory insulation reliability can be achieved.

Furthermore, when the compound A in the paste composition is cured by light, patterning by a photolithography method can be conducted. When a conventional paste composition is used, the composition is eluted upon development because of poor curing of the exposed portion, resulting in an unclear pattern shape, and also the residue of the paste composition might arise upon development because of low solubility of the unexposed portion. When the paste composition in an embodiment of the present invention is used, the compound A is polymerized in the state of trapping inorganic particles in the exposed portion to form a firm network containing inorganic particles as a starting point, thereby suppressing swelling and dissolution of the exposed portion upon development, and thus a clear pattern shape can be realized. In the unexposed portion, the compound A has satisfactory affinity with inorganic particles and inorganic particles maintain high dispersibility upon development without being aggregated. Therefore, the unexposed portion is immediately eluted in a developing solution, thus making it possible to decrease the residue upon development. When an aqueous alkali solution is used as the developing solution, a clear pattern can be formed by immediately dissolving the unexposed portion because of satisfactory solubility of the compound A per se in the aqueous alkali solution.

When $R^2$ in the general formulas (1) to (4) is a hydrogen atom, the compound A is terminated with a carboxyl group and dispersibility of inorganic particles becomes more satisfactory and insulation reliability of the resultant dielectric composition is more improved, favorably.

For the purpose of satisfactorily dispersing inorganic particles, it is preferred that a polymerizable group $R^1$ of the compound A has satisfactory affinity with an organic solvent and other compounds contained in the paste composition. Examples thereof include a vinyl group, an acrylate group, a methacrylate group, an epoxy acrylate group, an epoxy methacrylate group and an epoxy group. It is particularly preferred that $R^1$ is represented by the general formula (6) shown below:

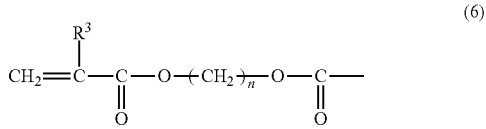

in the general formula (6), $R^3$ represents a hydrogen atom or a methyl group, and n is an integer of 1 to 3.

The polymerizable group in the general formula (6) is an acrylate group when $R^3$ is a hydrogen atom, or a methacrylate group when $R^3$ is a methyl group. The acrylate group or methacrylate group has an unsaturated bond and enables the radical polymerization by light irradiation or heat. When radical polymerization is conducted by light, a wiring pattern can be formed by applying a photolithography method of irradiation with light through a photomask. The acrylate group in which $R^3$ is a hydrogen atom is preferred because polymerizability becomes more satisfactory.

Among the compounds A represented by the general formulas (1) to (4), a compound in which $R^2$ is a hydrogen atom, $R^1$ is a monovalent group represented by the general formula (6) and n is 2 is preferred. When this compound is used, dispersibility of inorganic particles becomes more satisfactory. Since inorganic particles dispersed when the paste composition is cured maintain a dispersion state without being aggregated, leak current of the resultant dielectric composition is suppressed and voltage endurance characteristics are improved. Therefore, an interlayer insulating film having high insulation reliability can be formed.

Specific examples of the compounds A represented by the general formulas (1) to (4) are those shown below manufactured by KYOEISHA CHEMICAL Co., LTD. under the trade name of "HOA-HH" (which is represented by the general formula (1) in which $R^2$ is a hydrogen atom, $R^1$ is represented by the general formula (6), n is 2, and $R^3$ is a hydrogen atom), under the trade name of "HOA-MPL" (which is represented by the general formula (4) in which $R^2$ is a hydrogen atom, $R^1$ is represented by the general formula (6), n is 2, and $R^3$ is a hydrogen atom), and under the trade name of "HOA-MPE" (which is represented by the general formula (4) in which $R^2$ is represented by the general formula (5), m is 2, $R^1$ is represented by the general formula (6), $R^3$ is a hydrogen atom, and n is 2).

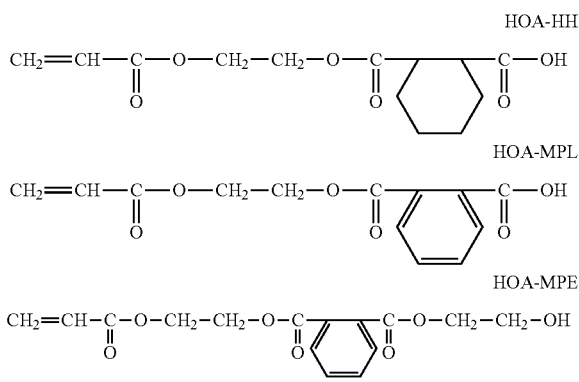

Particularly, "HOA-MPL" can disperse inorganic particles extremely satisfactorily, and insulation reliability is more improved. The compounds A may be used alone, or plural kinds thereof may be used in combination.

In an embodiment of the paste composition of the present invention, the content of the compound A is preferably 1 part by weight or more and 20 parts by weight or less based on 100 parts by weight of inorganic particles. When the content of the compound A is 1 part by weight or more based on 100 parts by weight of inorganic particles, dispersibility of inorganic particles becomes satisfactory, and insulation reliability and developability of the dielectric composition obtained from the paste composition are improved. In contrast, the content of the compound A is 20 parts by weight or less based on 100 parts by weight of inorganic particles, deterioration of heat resistance and dielectric constant of the dielectric composition can be suppressed by characteristics of the compound A per se.

As described above, regarding the paste composition in an embodiment of the present invention, the compound A is polymerized to form a matrix in the dielectric composition. However, the paste composition may further contain a resin which forms a matrix. Examples of the resin to be used include thermosetting or UV-curable resins having a polymerizable group, such as polyamic acid, a vinyl resin, a norbornene resin, an epoxy resin, an acrylate resin, a methacrylate resin, an epoxy acrylate resin, an epoxy methacrylate resin, a cyanate resin, a bismaleimide-triazine resin, a benzocyclobutene resin and a siloxane resin. In addition, resins having no polymerizable group, such as polystyrene, polyetherimide, polyphenyleneether, a polyimide resin and an aramid resin are exemplified. These resins may be used alone, or plural kinds thereof may be used in combination in a proper mixing ratio.

In applications where heat resistance is required in the process, among the above resins, resins having a polymerizable group, such as a thermosetting resin and a UV-curable resin; and high heat-resistant resins such as a polyimide resin and an aramid resin are preferred. When the dielectric composition obtained from the paste composition is used for the interlayer insulating film, the UV-curable resin is preferably selected because patterning of an interlayer insulating film using a photolithography method can be realized. When the epoxy resin is cation-polymerized, the polymerization reaction may be delayed because cationic active species are adsorbed on inorganic particles. Therefore, a resin selected from an acrylate resin, a methacrylate resin, an epoxy acrylate resin and an epoxy methacrylate resin, which is suited for radical polymerization, is preferred. It is also preferred to use a resin having a polymerizable group in combination with a high heat-resistant resin.

In the paste composition in an embodiment of the present invention, a mixing ratio of the compound A to the resin can be optionally set. It is preferred that the sum of the contents of the compound A and the resin is 10% by weight or more and 30% by weight or less based on the solid component excluding a volatile component such as an organic solvent in the paste composition. When the sum of the contents of the compound A and the resin is 10% by weight or more based on the solid component, insulation reliability and developability of the resultant dielectric composition are improved. Also, cracking resistance and adhesion with the substrate are improved. The sum of the contents of compound A and the resin is more preferably 15% by weight or more based on the solid component since the effects are further enhanced. When the sum of the contents of the compound A and the resin is 30% by weight or less based on the solid component, a dielectric constant of the resultant dielectric composition can be increased, and also a low linear expansion coefficient and a high elastic modulus can be realized. The sum of the contents of the compound A and the resin is more preferably 20% by weight or less based on the solid component since these effects are more enhanced.

The paste composition in an embodiment of the present invention may contain a polymerization promoter capable of generating active species such as radical cations and anions so as to promote polymerization of the compound A and the resin. Some polymerization promoters can be activated by light irradiation and heat treatment, and can be properly used according to applications. When the paste composition is formed into a film and patterning is conducted by a photolithography method, a polymerization promoter which is activated by light irradiation is used. Examples of the polymerization promoter which generates a radical under UV irradiation include an oxime compound, a benzophenone compound, a triazine compound and a benzotriazole compound. Examples of the polymerization promoter which generates a cation under UV irradiation include a phosphonium compound, a sulfonium compound and an iodonium compound.

The paste composition in an embodiment of the present invention contains high dielectric constant inorganic particles having a perovskite crystal structure or a complex perovskite crystal structure.

It is preferred to use inorganic particles having a dielectric constant of 50 to 30,000. When inorganic particles having a dielectric constant of 50 or more are used, it becomes easy to obtain a dielectric composition having sufficiently large dielectric constant. Inorganic particles having a dielectric constant of 30,000 or less are preferred because temperature dependency of the dielectric constant tends to decrease. The dielectric constant of inorganic particles as used herein means a relative dielectric constant of a sintered body obtained by using inorganic particles as a raw powder and heating and firing the inorganic particles. The relative dielectric constant of the sintered body is measured by the following procedure. Inorganic particles, a binder resin such as polyvinyl alcohol, and an organic solvent or water are mixed to prepare a pasty composition, and the pasty composition is filled in a pelleting machine and then dried to obtain a pellet-shaped solid body. The pellet-shaped solid body thus obtained is fired at about 900 to 1,200° C. thereby to decompose and remove the binder resin and to sinter inorganic particles, and thus a sintered body made only of an inorganic component can be obtained. At this time, it is desired that the sintered body contains sufficiently small void and a void ratio calculated from a theoretical density and a measured density is 1% or less. On this sintered body pellet, upper and lower electrodes are formed and a relative dielectric constant is calculated from the measurement results of the electrostatic capacity and size.

Examples of inorganic particles having a perovskite crystal structure or a complex perovskite crystal structure include barium titanate-based, barium titanate zirconate-based, strontium titanate-based, calcium titanate-based, bismuth titanate-based, magnesium titanate-based, barium neodymium titanate-based, barium stannate titanate-based, barium magnesium niobate-based, barium magnesium tantalate-based, lead titanate-based, lead zirconate, lead zirconate titanate, lead niobate-based, lead magnesium niobate-based, lead nickel niobate-based, lead tungstate-based, calcium tungstate-based, lead magnesium tungstate-based and titanium dioxide-based inorganic particles. Herein, barium titanate-based inorganic particles mean a generic term including, in addition to barium titanate, a solid solution containing barium titanate as a base metal, obtained by substituting a partial element in a barium titanate crystal with the other element, or incorporating the other element into a crystal structure. The same shall apply to other inorganic particles and other inorganic particles mean a generic term including a solid solution containing each of them as a base metal. These inorganic particles having a perovskite crystal structure or a complex perovskite crystal structure can be used alone, or two or more kinds thereof can be used in combination. In order to simultaneously satisfy a dielectric composition having a high dielectric constant, and commercial convenience, barium titanate-based inorganic particles are preferably used. For the purpose of improving dielectric characteristics and temperature stability, a small amount of a shifter and a depressor agent may be added.

Examples of the method of producing inorganic particles include a solid phase reaction method, a hydrothermal crystallization method, a supercritical hydrothermal crystallization method, a sol-gel method and an oxalate method. As the method of producing inorganic particles having a large average particle diameter, a solid phase reaction method or an oxalate method is preferably used in view of a high dielectric constant and quality stability. As the method of producing inorganic particles having a small average particle diameter, any one of a hydrothermal crystallization method, a supercritical hydrothermal crystallization method, a sol-gel method and an alkoxide method is preferably used because it is easy to decrease the particle diameter.

Examples of the shape of inorganic particles include a spherical shape, a generally spherical shape, an ellipsoidal shape, a needle shape, a tabular shape, a squamous shape and a stick shape, and a spherical shape and a generally spherical shape are particularly preferred due to the following reason. That is, since spherical or generally spherical inorganic particles have the smallest specific surface area, aggregation of inorganic particles and deterioration of resin fluidity are less likely to occur. These inorganic particles can be used alone, or two or more kinds thereof can be used in combination.

In one aspect of the present invention, the content of inorganic particles in the paste composition is preferably 70% by weight or more and 90% by weight or less based on the solid component excluding a volatile component such as an organic solvent. When the content of inorganic particles is 70% by weight or more based on the solid component in the paste composition, the dielectric constant of the resultant dielectric composition can be increased, and also a low linear expansion coefficient and a high elastic modulus can be realized. The content of inorganic particles is more preferably 80% by weight or more based on the solid component in the paste composition. When the content of inorganic particles is 90% by weight or less based on the solid component in the paste composition, insulation reliability and developability of the resultant dielectric composition are improved. Also, cracking resistance and adhesion with the substrate are improved. The content of inorganic particles is more preferably 85% by weight or less based on the solid component in the paste composition.

The average particle diameter of inorganic particles is preferably 60 nm or more and 1 μm or less and more preferably 200 nm or more and 300 nm or less. The average particle diameter as used herein means a number average particle diameter. In inorganic particles in the paste composition, those in the state of primary particles in which aggregation is completely loosened, and those in the state where plural primary particles are aggregated (secondary particles) exist. The particle diameter of inorganic particles in the paste composition as used herein means a particle diameter of particle in the case of non-aggregated primary particles, or means a particle diameter of an aggregate in the case of aggregated primary particles. Examples of the method of measuring an average particle diameter of inorganic particles in a paste composition include a method in which particles are directly observed by SEM (scanning electron microscope) or TEM (transmission electron microscope) and a number average of particle diameters is calculated. When average particle diameter of inorganic particles in the paste composition is 1 µm or less, homogeneity is improved in each form of the paste composition and the dielectric composition. When the dielectric composition is used as an interlayer insulating film for a capacitor, a capacitor having a uniform electrostatic capacity can be produced because dispersion in thickness decreases. Also, developability in patterning, to which a photolithography method has been applied, becomes satisfactory. Furthermore, when the average particle diameter of inorganic particles in the paste composition is 300 nm or less, these effects are more improved. In contrast, when he average particle diameter of inorganic particles in the paste composition is 60 nm or more, dispersibility of particles is improved because a specific surface area to the volume of particles decreases. Also, since a dielectric constant due to crystal distortion of inorganic particles increases, a dielectric composition having a high dielectric constant can be obtained. Furthermore, when the average particle diameter of inorganic particles in the paste composition is 200 nm or more, these effects are more improved.

Inorganic particles may be subjected to a surface treatment. Examples of the surface treatment include, in addition to treatments with various silane-based, titanium-based and aluminum-based coupling agents, and fatty acid, a rosin treatment, an acidic treatment and a basic treatment.

The paste composition in an embodiment of the present invention contains an organic solvent. Examples of the organic solvent include N,N-dimethylacetamide, N,N-dimethylformamide, N-methyl-2-pyrrolidone, dimethylimidazolidinone, dimethyl sulfoxide, γ-butyrolactone, ethyl lactate, 1-methoxy-2-propanol, 1-ethoxy-2-propanol, ethylene glycol mono-n-propylether, diacetone alcohol, tetrahydrofurfuryl alcohol and propylene glycol monomethyl ether acetate. These organic solvents can be used alone, or two or more kinds thereof can be used in combination. Tetrahydrofurfuryl alcohol is used particularly preferably.

The paste composition in an embodiment of the present invention preferably contains a silane coupling agent. When the paste composition contains the silane coupling agent, since pattern thinning and peeling of the exposed portion can be decreased and the occurrence of cracking can be suppressed in patterning using a photolithography method, a clear pattern shape can be realized. It is usually known that the silane coupling agent has the effect of improving adhesion between an inorganic material and an organic material. Also in one aspect of the present invention, it is possible to expect the effect of improving adhesion between a resin component and an inorganic component in the composition and improving adhesion between a resin component and an inorganic substrate such as a silicon wafer in the composition, and decreasing pattern thinning and peeling of the exposed portion and suppressing the occurrence of cracking in patterning using a photolithography method.

As the silane coupling agent, 3-glycidoxypropyltrimethoxysilane, 3-glycidoxypropyltriethoxysilane, 3-methacryloxypropyltrimethoxysilane, 3-methacryloxypropyltriethoxysilane, N-2(aminoethyl)-3-aminopropyltrimethoxysilane, N-2(aminoethyl)-3-aminopropyltriethoxysilane, 3-isocyanatepropyltrimethoxysilane and 3-isocyanatepropyltriethoxysilane are preferred.

The content of the silane coupling agent is preferably 0.1 part by weight or more and 5 parts by weight or less based on 100 parts by weight of inorganic particles. When the content of the silane coupling agent is 0.1 part by weight or more based on 100 parts by weight of inorganic particles, the effect of improving developability in the above photolithography method is enhanced. When the content of the silane coupling agent is 5 parts by weight or less based on 100 parts by weight of inorganic particles, a decrease in dielectric constant of the dielectric composition can be suppressed by characteristics of the silane coupling agent per se.

The paste composition in an embodiment of the present invention may also contain a dispersing agent other than the compound A. When the sum of the contents of the compound A and the dispersing agent other than the compound A is preferably 1 part by weight or more and 20 parts by weight or less based on 100 parts by weight of inorganic particles. When the sum of the contents of the compound A and the dispersing agent other than the compound A is 1 part by weight or more, a remarkable effect of improving dispersibility of inorganic particles is exerted. When the sum of the contents is 20 parts by weight or less, deterioration of heat resistance and dielectric constant of the dielectric composition obtained from the paste composition can be suppressed.

In addition, the paste composition in an embodiment of the present invention may contain pH adjustors, surfactants, humectants, polymerization promoters, polymerization inhibitors, plasticizers and antioxidants.

The method of producing a paste composition according to aspects of the present invention will be described in detail below.

Inorganic particles (including those in the state of secondary particles or aggregated state), a compound A, an organic solvent and, if necessary, other resins, polymerization promoters, defoamers, pH adjustors, antioxidants, polymerization inhibitors, plasticizers and silane coupling agents are mixed in a predetermined amount and then stirred. Immediately after mixing, since a surface of inorganic particles is coated with a layer of air, viscosity may increase because of insufficient wetting between inorganic particles and an organic solvent. In that case, it is preferred to stir by a rotary blade until inorganic particles are completely wetted with the organic solvent.

In the case of mixing inorganic particles, the entire amount of substances such as a resin and a silane coupling agent required to produce the objective dielectric composition may be added, or a portion of the requisite amount of substances may be added upon a dispersion treatment, followed by the addition of the remaining amount of substances. When the entire amount of these substances are added before the dispersion treatment, substances in the paste composition can be uniformly mixed as compared with the case of adding after the dispersion treatment, while the viscosity of the paste composition increases and efficiency of the dispersion treatment becomes inferior, or storage stability of the paste composition after the dispersion treatment may deteriorate. It is also possible to gradually add resins and other substances while measuring properties such as viscosity of the paste composition in the dispersion treatment. It is preferred to add the polymerization promoter immediately before the production of the dielectric composition in view of storage stability of the paste composition.

After mixing and stirring inorganic particles, a compound A, an organic solvent, and other requisite substances, the dispersion treatment of inorganic particles is conducted. Since inorganic particles used preferably in the present invention has a small average primary particle diameter, it is preferred to use microbeads as dispersion media so as to achieve uniform dispersion by loosing aggregation between particles.

Since preferred average particle diameter of inorganic particles is 60 nm or more and 1 μm or less, it is preferred to use beads having an average particle diameter of 0.03 mm or more and 0.5 mm or less as dispersion media. When the average particle diameter of beads is 0.5 mm or less, when the paste composition passes through the space between beads, inorganic particles are contacted with beads at a high frequency, thus obtaining sufficient dispersion effect. When the average particle diameter of beads is 0.03 mm or more, each of beads has sufficiently large momentum and shear stress enough to loosen aggregation of inorganic particles is obtained. In the dielectric composition obtained by curing the paste composition prepared by using this method, inorganic particles can be filled in the resin more densely. The capacitor using this dielectric composition in an interlayer insulating film shows a small leak current and has a large withstanding voltage.

Examples of the method of dispersing inorganic particles in the paste composition in which microbeads are used as dispersion media include a method using a ball mill, a homogenizer or a beads mill. Examples of the homogenizer include "EXCEL AUTO" manufactured by NIHONSEIKI KAISHA LTD. The dispersion treatment using a homogenizer is conducted, for example, for about 1 hour after adjusting a peripheral speed of tip of a rotary knife within a range from 1 to 10 m/s. Since heat is generated during a homogenizer treatment, the treatment is preferably conducted in an ice bath. Examples of the beads mill include "ULTRA APEX MILL" manufactured by KOTOBUKI INDUSTRIES CO., LTD. and "STAR MILL" manufactured by ASHIZAWA FINETECH LTD. The average particle diameter of beads used in the beads mill is preferably 0.01 mm or more and 0.5 mm or less.

As beads of dispersion media, beads made of metal, ceramic and glass can be preferably used. Specific examples of the material include stainless steel, iron, copper, chromium, nickel, titania, silicon nitride, silicon carbide, alumina, zirconia, zirconium silicate, barium titanate, glass silicate and quartz. It is particularly preferred to use zirconia beads having high hardness. As zirconia, yttria stabilized zirconia is preferably used because of its large strength.

The dispersion treatment may be conducted at a time using small beads, or may be conducted while stepwisely varying the size of beads. For example, the dispersion treatment may be conducted using microbeads after the dispersion treatment is conducted by using beads having a particle diameter of 0.5 mm until the average particle diameter of inorganic particles becomes about several hundred nm.

The amount of time spent in the dispersion treatment is appropriately set according to the kind and composition ratio of substances constituting the paste composition, such as inorganic particles, a compound A and an organic solvent. It is preferred to perform sampling of the paste composition every constant time and measurement of the average particle diameter of inorganic particles in the paste composition because variation of the dispersion state with a lapse of time can be grasped and completion of the dispersion treatment can be decided. Examples of the apparatus for measuring the particle diameter of inorganic particles in the paste composition include a dynamic light scattering type particle size analyzer manufactured by Sysmex Corporation under the trade name of "Zetasizer Nano ZS".

Examples of the method of separating beads from the paste composition after the dispersion treatment include a method of passing through a sieve having an opening diameter smaller than the diameter of beads and a method by means of centrifugal separation.

When the paste composition is further mixed with a substance such as a resin after completion of the dispersion treatment of inorganic particles, a treatment using a ball mill or a roll mill can be conducted so as to homogenize the paste composition. When bubbles are mixed into the paste composition by a mixing treatment, bubbles are removed by allowing the paste composition to stand, maintaining under reduced pressure or treating using a stirring and defoaming machine, and thus it is made possible to avoid mixing of bubbles into a dielectric composition produced by using the paste composition.

In order to adjust viscosity of the paste composition, an organic solvent may be further added, or an appropriate amount of an organic solvent may be removed by heating or evacuation. Also, the polymerization reaction of the compound A or the resin may be appropriately allowed to proceed by a heat treatment or light irradiation.

A dielectric composition comprising a resin and inorganic particles dispersed in the resin can be produced by curing the paste composition thus prepared as described above. For example, a dielectric composition can be prepared by applying a paste composition on an adherend (for example, substrate), removing an organic solvent and curing the paste composition through a heat treatment or light irradiation. When a paste composition which is cured by light irradiation is used, a dielectric composition having a desired pattern shape can be produced by a photolithography method. Since the dielectric composition in an embodiment of the present invention is not a sintered body, it is not necessary to completely decompose and remove the resin and it is preferred to heat within a heatproof temperature of electronic components (for example, a temperature of 500° C. or lower).

In order to increase adhesion between the adherend such as a silicon wafer and the paste composition, a surface of the adherend can be subjected to a surface treatment with a silane coupling agent. For example, a solution prepared by dissolving 0.5 to 20% by weight of a silane coupling agent in an organic solvent such as isopropanol, ethanol, methanol, water, tetrahydrofuran, propylene glycol monomethyl ether acetate, propylene glycol monomethyl ether or ethyl lactate is applied on an adherend by spin coating, immersion, spray coating or steam treatment. Depending on the situation, the reaction between the substrate and the silane coupling agent is allowed to proceed by raising the temperature from 50° C. to 300° C. It is also effective to remove water adsorbed on a surface of the adherend by heating the adherend at high temperature as a surface treatment method. In this case, heating can be conducted at the temperature from 80° C. to 400° C.

The adherend on which the paste composition is applied can be selected from a silicon wafer, ceramics, gallium arsenide, an organic circuit board, an inorganic circuit board, and those in which a constituent material is disposed on these substrates, but is not limited thereto. Examples of the organic circuit board include glass base material copper clad laminates such as glass cloth-epoxy copper clad laminate; composite copper clad laminates such as glass nonwoven fabric-epoxy copper clad laminate; heat-resistant-thermoplastic substrates such as polyetherimide resin substrate, polyetherketone resin substrate and polysulfone resin substrate; and flexible substrates such as polyester copper clad film substrate and polyimide copper clad film substrate.

Examples of the inorganic circuit board include ceramic substrates such as alumina substrate, aluminum nitride substrate and silicon carbide substrate; and metal substrates such as aluminum-based substrate and iron-based substrate. Examples of the constituent material of the circuit include a conductor containing metal such as silver, gold or copper; a resistor containing an inorganic oxide; a low dielectric substance containing a glass-based material and/or a resin; a high dielectric substance containing a resin and high dielectric constant inorganic particles; and an insulating material containing a glass-based material.

Examples of the method of applying a paste composition on the adherend include a spin coating method using a spinner, a spray coating method, a roll coating method, a screen printing method, a blade coating method, a die coating method, a calender coating method, a meniscus coating method and a bar coating method. The thickness of the coating film varies depending on the coating technique, and the concentration of a solid component and viscosity of the composition. However, coating is conducted so that the thickness after drying becomes within a range from 0.1 to 150 μm.

Next, the organic solvent is removed from the paste composition film formed on the substrate. Examples of the method of removing the organic solvent include heat drying by an oven, a hot plate or infrared rays, and vacuum drying. Heat drying is preferably conducted at a temperature within a range from 50° C. to 180° C. for 1 minute to several hours.

After removing the organic solvent, the curing reaction of the paste composition is allowed to proceed by a heat treatment or light irradiation according to the compound A in the paste composition used or a curing mechanism of the resin. In this case, plural treatments may be used in combination, for example, a heat treatment is conducted after light irradiation so as to enable complete proceeding of curing. The temperature of the heat treatment is a constant temperature or stepwisely raised within a range from 120° C. to 400° C., while the treatment time is within a range from 5 minutes to 5 hours. When the heat treatment is conducted at 100° C. or higher, the treatment is preferably conducted under an inert atmosphere such as nitrogen because oxidation of the resin is suppressed. In the case of curing the composition using a polymerization promoter capable of generating a radical which is deactivated by oxygen, it is also preferred to treat under an inert atmosphere such as nitrogen because polymerization is not inhibited.

When patterning is conducted on the paste composition film after removal of the organic solvent by a photolithography method, exposure is conducted through a mask having a desired pattern. It is preferred to use, as a light source for exposure, i-rays (365 nm), h-rays (405 nm) or g-rays (436 nm) from a mercury lamp.

After exposure, a dielectric composition having a desired pattern shape can be obtained by removing the unexposed portion using a developing solution. As the developing solution for an alkali development, for example, an aqueous solution of a compound which exhibits alkalinity, such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine and hexamethylenediamine are preferable. Depending on the situation, it is possible to add one or plural kinds of polar solvents such as N-methyl-2-pyrrolidone, N,N-dimethylformamide, N,N-dimethylacetamide, dimethyl sulfoxide and γ-butyrolactone; alcohols such as methanol, ethanol and isopropanol; esters such as ethyl lactate and propylene glycol monomethyl ether acetate; and ketones such as cyclopentanone, cyclohexanone, isobutylketone and methyl isobutyl ketone, to these aqueous alkali solution. It is also possible to use those prepared by adding a surfactant to these aqueous alkali solutions as the developing solution. It is preferred to use the developing solution containing a surfactant added therein because it is possible to prevent the paste composition of the unexposed portion from remaining as the residue on the substrate upon development. The residue as used herein means the resin component and inorganic particles adhered to or accumulated on the unexposed portion on the substrate in the development step. The surfactant is preferably a nonionic surfactant and more preferably an ether type nonionic surfactant. Examples of the ether type nonionic surfactant include "EMULGEN® A60" (manufactured by Kao Corporation), "EMULGEN® A90" (manufactured by Kao Corporation), "EMULGEN® A500" (manufactured by Kao Corporation), "EMULGEN® B66" (manufactured by Kao Corporation), "EMULGEN® LS-106" (manufactured by Kao Corporation), "EMULGEN® LS-110" (manufactured by Kao Corporation), "EMULGEN® LS-114" (manufactured by Kao Corporation), "EMULGEN® MS-110" (manufactured by Kao Corporation), "NOIGEN® EA-87" (manufactured by Dai-ichi Kogyo Seiyaku Co., Ltd.), "NOIGEN® EA-137" (manufactured by Dai-ichi Kogyo Seiyaku Co., Ltd.), "NOIGEN® EA-157" (manufactured by Dai-ichi Kogyo Seiyaku Co., Ltd.), "NOIGEN® EA-167" (manufactured by Dai-ichi Kogyo Seiyaku Co., Ltd.) and "NOIGEN® EA-177" (manufactured by Dai-ichi Kogyo Seiyaku Co., Ltd.). These surfactants may be contained in embodiments of the paste composition of the present invention. When the developing solution or the paste composition contains the ether type nonionic surfactant, satisfactory patterning can be conducted even in the case of a substrate having poor wettability to the alkali developing solution such as a substrate made of silver or a metal compound containing silver.

Examples of the developing solution, which can be used for organic development, include polar solvents such as N-methyl-2-pyrrolidone, N-acetyl-2-pyrrolidone, N,N-dimethylacetamide, N,N-dimethylformamide, dimethyl sulfoxide and hexamethylphosphortriamide. Alternatively, a mixed solution prepared by mixing these polar solvents with methanol, ethanol, isopropyl alcohol, xylene, water, methyl carbitol and ethyl carbitol can also be used.

The development can be conducted by a method of spraying the above developing solution on a surface of a substrate on which a dielectric composition is provided while allowing the substrate to stand or rotating the substrate, or a method of immersing the substrate in the developing solution, or a method of applying ultrasonic wave to the substrate while immersing.

After the development, the substrate may be subjected to a rinsing treatment with water. Herein, a rinsing treatment may be conducted using a solution prepared by adding alcohols such as ethanol or isopropyl alcohol; or esters such as ethyl lactate or propylene glycol monomethyl ether acetate. Also, a heat treatment may be conducted after the development so as to perform complete proceeding of curing of the exposed portion.

The void ratio of the dielectric composition is preferable as small as possible. When the void ratio is small, the proportion of inorganic particles in the film volume is large and it is easy to obtain a dielectric composition having a large dielectric constant. When the void ratio is small, deterioration of insulation resistance, increase in leak current and decrease in bending strength do not occur.

The form of the dielectric composition in an embodiment of the present invention is not particularly limited and can be selected from a film, a stick and a sphere according to applications. Of these forms, a film is preferable. The film as used herein also includes a film, a sheet and a plate. As a matter of course, the film can also be subjected to processing according to applications, such as formation of via holes for conduction, adjustment of impedance, electrostatic capacity or internal stress or, imparting of a heat radiation function.

When the dielectric composition is used as an interlayer insulating film for a capacitor, the thickness can be optionally set within the range where an electrostatic capacity satisfies the desired value, but is preferably 0.5 µm or more, and more preferably 1.5 µm or more. The thickness is preferably 10 µm or less, and more preferably 5 µm or less. In order to ensure a large electrostatic capacity as the capacitor, the thickness is preferable as thin as possible. When the thickness is less than 0.5 µm, pinholes are likely to be generated and it becomes difficult to obtain insulation reliability. When the thickness is 1.5 µm or more, the occurrence of defects such as pinholes of the dielectric composition is inhibited and the leak current can be decreased. Also, a dielectric dissipation factor hardly increases after a pressure cooker test (PCT) as an acceleration test of durability. When the thickness is more than 10 µm, a large dielectric constant is required so as to obtain sufficient capacitor performances, and also it may become difficult to improve a packaging density. When the thickness is 5 µm or less, it is easy to obtain a capacitor having a large electrostatic capacity and, when used as a decoupling capacitor, sufficient function of the decoupling capacitor can be exerted.

Examples of the method of an insulation reliability test of the dielectric composition include a high-temperature high-humidity bias test, a highly accelerated temperature/humidity stress test (HAST), a pressure cooker test (PCT) and a thermal shock test. The high-temperature high-humidity bias test is a test method with respect to deterioration of appearance of a sample when stored under the environment of a constant temperature and constant relative humidity, and is also an acceleration test method of evaluating deterioration of insulation resistance due to ion migration by application of a bias voltage. It is possible to use, as a sample of the insulation reliability test, those having any known structure such as a sandwich structure in which a dielectric composition is sandwiched between an upper electrode and a lower electrode, or a structure in which a dielectric composition is formed on a comb tooth electrode.

There is no particular limitation on applications of the paste composition and the dielectric composition according to aspects of the present invention. For example, the paste composition and the dielectric composition of the present invention can be used, as a high dielectric constant layer, for an interlayer insulating film for an embedded capacitor of a printed circuit board, and also can be applied to various electronic components and devices, such as an interlayer insulating film of a multi-layered substrate, a frequency filter, a radio antenna and an electromagnetic shield.

The dielectric composition in an embodiment of the present invention is preferably used as an interlayer insulating film for a capacitor. The method of forming a capacitor using the dielectric composition of the present invention is not particularly limited. For example, as described above, the capacitor can be obtained by forming a film of the dielectric composition of the present invention as the interlayer insulating film on the substrate, and forming electrodes thereon. It is also possible to form a capacitor having a fine pattern by applying a photolithography method to the paste composition of the present invention, and to provide the capacitor on a semiconductor device on which a transistor is formed. Therefore, wiring from the semiconductor device to the capacitor embedded in the substrate, which causes parasitic inductance, becomes unnecessary, thus contributing to speeding up and densification of a system.

The electrostatic capacity per area of the interlayer insulating film for a capacitor, using the dielectric composition in an embodiment of the present invention, is preferably 5 $nF/cm^2$ or more, more preferably 10 $nF/cm^2$ or more. When the electrostatic capacity is less than 5 $nF/cm^2$, it is impossible to sufficiently fulfill the function of separating from a power supply of the entire system of a decoupling capacitor when used as the decoupling capacitor.

EXAMPLES

Examples of the present invention will be described below, but the present invention is not limited by these Examples. The paste composition and the dielectric composition in Examples were evaluated by the following methods.

<Method of Measuring Average Particle Diameter of Inorganic Particles in Paste Composition>

A paste composition was dropped on a carbon-deposited collodion film and, after removing an organic solvent with heating, inorganic particles were observed by a transmission electron microscope "H-7100FA" (manufactured by Hitachi Ltd.). The magnification enabling easy observation is selected according to the particle diameter of inorganic particles. For example, when the average particle diameter of inorganic particles is about 50 nm, the magnification is properly about 10,000 times and, when the average particle diameter of inorganic particles is about 500 nm, the magnification is properly about 1,000 times. An acceleration voltage was set at 100 kV. Observed images were taken into a computer as digital images and the particle diameter of spherically approximated arbitrary 100 particles observed was determined by an image processing soft "FlvFs" (manufactured by FLOVEL CO., LTD.) and then number average particle diameter was calculated. When primary particles exist in an aggregated state, the particle diameter of an aggregate was measured.

<Method of Measuring Thickness of Dielectric Composition>

Using a probe type step profiler "SURFCOM® 1400" (manufactured by SEIMITSU CO., LTD.), the measurement was conducted. The thickness was measured at three random points by the following procedure. That is, the film was removed by cutting using a metal piece and the height of the step thus formed and an average of values measured at three points was taken as a thickness.

<Method of Measuring Dielectric Constant of Dielectric Composition>

A film made of a dielectric composition was formed on a substrate and electrodes were formed on the film by a vacuum deposition method. The aluminum electrodes are an electrode measuring 300 nm in thickness and 10 mm in diameter for measurement of a circular pattern, and a guard electrode having an inner diameter of 11.5 mm with a ring-shaped pattern. The portion sandwiched between the electrode for measurement and the substrate corresponds to the region to be measured. The electrostatic capacity at a frequency of 1 MHz in the region to be measured was measured using an impedance analyzer "4294A" and a sample holder "16451B" (both of which are manufactured by Agilent Technologies). The dielectric constant was calculated, as a relative dielectric constant, from the electrostatic capacity and the size of the region to be measured.

<Method of Evaluating Developability of Dielectric Composition>

A film made of a dielectric composition was formed on a substrate. The film made of the dielectric composition was patterned into nine kinds of units each having a different line and space value, one unit being composed of the group of straight lines arranged at a constant line and space (L/S). The value of line and space of each unit was set at 500/500, 250/250, 100/100, 50/50, 40/40, 30/30, 25/25, 20/20 and 15/15 μm, respectively. The dielectric composition after patterning was observed using an optical microscope. As a result, the unit having a minimum line and space, which is free from the residue between patterns and is also free from pattern peeling, was confirmed. The value of this minimum line and space was taken as a developable L/S.

<Method of Evaluating Insulation Reliability of Dielectric Composition>

Insulation reliability of the dielectric composition was evaluated by a high-temperature high-humidity bias test. As samples of an insulation reliability test, two kinds of samples, for example, a sample having a sandwich structure in which the dielectric composition is sandwiched between an upper electrode and a lower electrode, and a sample in which a dielectric composition is formed on a comb tooth electrode were produced and then evaluated.

Production and evaluation of a sandwich structure sample will be described. On a substrate on which a 0.5 μm thick aluminum electrode layer is formed, a film made of a dielectric composition was formed. The thickness of the dielectric composition was set at 5 μm. Then, an upper electrode made of aluminum was formed on the film by a vacuum deposition method. The aluminum electrode is an electrode with a circular pattern measuring 300 nm in thickness and 11.5 mm in diameter. The portion sandwiched between an upper electrode and a substrate corresponds to the region to be measured. In the measurement, a system for evaluation of insulation deterioration characteristic "ETAC SIR13" (manufactured by Kusumoto Chemicals, Ltd.) was used. Each sample was placed in a high-temperature high-humidity bath set at a temperature of 85° C. and a humidity of 85% RH. Five minutes after the atmosphere in the bath became stable, a voltage was applied between the upper electrode and the substrate and then variation of insulation resistance with a lapse of time was measured. Using the upper electrode side as a positive electrode and using the substrate side as a negative electrode, a voltage of 10 V was applied. Regarding variation of insulation resistance with a lapse of time, resistance value was read every 5 minutes and the absence of variation in resistance was confirmed, and also an initial resistance value and resistance values after a lapse of time of 200 hours, 500 hours and 1,000 hours were recorded. Samples having a resistance value of $10^8$ Ω·cm or more in terms of a volume resistance value were rated "Pass", whereas, samples having a resistance value of less than $10^8$ Ω·cm were rated "Failure".

Production and evaluation of a comb tooth electrode sample will be described below. A comb tooth-shaped substrate for evaluation (line and space (L/S) is 200 μm/10 μm), in which TiN (thickness: 0.1 μm) and a 99.5% Al-0.5% Cu alloy (thickness: 0.6 μm) as electrode materials are formed in this order on a silicon wafer on which a 1 μm thick oxidation film is formed, was produced and this substrate for evaluation was used as an "aluminum (Al) comb tooth electrode".

A comb tooth-shaped substrate for evaluation (line and space (L/S) is 10 μm/10 μm), in which Cr (thickness: 0.08 μm) and Cu (thickness: 0.25 μm) as electrode materials are formed in this order on a silicon wafer on which a 0.4 μm thick thermal oxide film and a 0.8 μm thick SiNx film are formed, was produced and this substrate for evaluation was used as a "copper (Cu) comb tooth electrode".

A comb tooth-shaped substrate for evaluation (line and space (L/S) is 20 μm/10 μm), in which Cr (thickness: 0.08 μm) and Ag (thickness: 0.25 μm) as electrode materials are formed in this order on a silicon wafer on which a 1 μm thick oxidation film is formed, was produced and this substrate for evaluation was used as a "silver (Ag) comb tooth electrode".

A sample, in which a film made of a dielectric composition is formed on an aluminum comb tooth electrode, a copper comb tooth electrode and a silver comb tooth electrode, was produced. The sample was placed in a high-temperature high-humidity bath set at a temperature of 85° C. and a humidity of 85% RH. Five minutes after the atmosphere in the bath became stable, a voltage was applied to both ends of a comb tooth electrode and then variation of insulation resistance with a lapse of time was measured for 1,000 hours. Regarding the applied voltage, a voltage of 20 V was applied based on a space of 10 μm of the comb tooth L/S and resistance value was read every 5 minutes, and also variation of insulation resistance with a lapse of time was measured. Samples having a resistance value of $10^8$ Ω or more after a lapse of time of 1,000 hours were rated "Pass", whereas, samples having a resistance value of less than $10^8$ Ω as a result of deterioration of insulation resistance before a lapse of time of 1,000 hours were rated "Failure". When samples were rated "Failure", the time when the resistance value became the value of less than $10^8$ Ω

<Compounds Used in Examples>

Compound A "HOA-MPL" manufactured by KYOEISHA CHEMICAL Co., LTD., which is represented by the general formula (4) shown above in which $R^2$ is a hydrogen atom, $R^1$ is represented by the general formula (6) shown above, n is 2, and $R^3$ is a hydrogen atom Compound A "HOA-MPE" manufactured by KYOEISHA CHEMICAL Co., LTD., which is represented by the general formula (4) shown above in which $R^2$ is represented by the general formula (5), m is 2, $R^1$ is represented by the general formula (6) shown above, $R^3$ is a hydrogen atom, and n is 2

Compound A "HOA-HH" manufactured by KYOEISHA CHEMICAL Co., LTD., which is represented by the general formula (1) shown above in which $R^2$ is a hydrogen atom, $R^1$ is represented by the general formula (6), n is 2, and $R^3$ is a hydrogen atom Silane coupling agent "KBM503" manufactured by Shin-Etsu Chemical Co., Ltd., whose chemical name is 3-methacryloxypropyltrimethoxysilane Example 1

Under a nitrogen gas flow, 30.03 g (0.082 mol) of 2,2-bis(3-amino-4-hydroxyphenyl)hexafluoropropane (BAHF), 1.24 g (0.005 mol) of 1,3-bis(3-aminopropyl)tetramethyldisiloxane, and 2.7 g (0.025 mol) of 3-aminophenol as an end-capping agent were dissolved in 100 g of N-methyl-2-pyrrolidone (NMP). To the solution, 31.02 g (0.1 mol) of bis(3,4-dicarboxyphenyl)ether dianhydride was added together with 30 g of NMP, followed by stirring at 20° C. for 1 hour and further stirring at 50° C. for 4 hours. After stirring at 180° C. for 5 hours, a resin solution was obtained. Next, 3 L of water was added to this resin solution to obtain a white polymer precipitate. This polymer precipitate was collected by filtration, washed three times with water and then dried in a vacuum dryer at 200° C. for 5 hours to obtain a polymer A. An infrared absorption spectrum of the resultant polymer A was measured. As a result, an absorption peak of an imide structure, assigned to polyimide, was detected at around 1780 $cm^{-1}$ and 1377 $cm^{-1}$. Next, a solution prepared by dissolving 10 g of a polymer A, 1.4 g of an oxime-based UV-active polymerization promoter "OXE02" (manufactured by Chiba Specialty Chemicals K.K.), 0.6 g of a 0.5% phenothiazine solution (ethyl lactate solution) of a polymerization inhibitor, 8.6 g of a thermally crosslinkable compound "HMOM-TP- HAP" (manufactured by Honshu Chemical Industry Co., Ltd., concentration: 20%, an ethyl lactate solution), 5.1 g of "PDBE-250" (manufactured by NOF CORPORATION, a compound having a polymerizable unsaturated double bond) and 0.6 g of dimethyloltricyclodecane diacrylate (compound having a polymerizable unsaturated double bond) in 5.1 g of diacetone alcohol and 3.7 g of ethyl lactate was stirred and degassed and then filtered under pressure using a filter having a retained particle diameter of 2 μm to obtain a resin solution A.

140 g of tetrahydrofurfuryl alcohol (THFA), 20 g of a compound A "HOA-MPL" and 400 g of inorganic particles "BT-02" (barium titanate secondary particles, manufactured by SAKAI CHEMICAL INDUSTRY CO., LTD., average primary particle diameter: 200 nm) were mixed. Next, a vessel of a beads mill "ULTRA APEX MILL UAM-015" (manufactured by KOTOBUKI INDUSTRIES CO., LTD.) was packed with 400 g of zirconia beads (manufactured by NIKKATO CORPORATION, YTZ ball, size: φ0.05 mm) and inorganic particles were dispersed by feeding and circulating the above mixed solution in the vessel while rotating a rotor. After dispersing at a peripheral speed of the rotor of 9.5 m/s for 2 hours, a paste composition B-1A was obtained.

140 g of a paste composition B-1A and 27 g of a resin solution A were charged in a polyethylene sample bottle having a volume of 250 ml and then rotationally mixed at 200 rpm on a ball mill stand for 1 hour to prepare a paste composition B-1B. A filling rate of inorganic particles (amount of inorganic particles based on the entire amount of a solid component of a paste composition) of the paste composition B-1B was 83.7% by weight. An average particle diameter of inorganic particles in the paste composition B-1B was 210 nm and inorganic particles were dispersed up to the particle diameter close to that of primary particles.

The paste composition B-1B was applied on an aluminum substrate measuring 6 cm×6 cm in shape and 0.3 mm in thickness using a spinner, prebaked at 100° C. using a hot plate for 3 minutes, and then subjected to whole radiation exposure at a light exposure of 500 mJ/cm$^2$ (in terms of a wavelength of 365 nm) using an exposure apparatus "PEM-6M" (manufactured by UNION OPTICAL CO., LTD.). Subsequently, a heat treatment was conducted at 280° C. for 60 minutes using INERT OVEN "INL-60" (manufactured by Koyo Thermo System Co., Ltd.) under a nitrogen atmosphere to obtain a film made of a dielectric composition on the aluminum substrate. A dielectric constant at a measuring frequency of 1 MHz of this film was 33, and a dielectric dissipation factor was 0.02.

Next, the paste composition B-1B was applied on a 4 inch silicon wafer on which a 10 nm thickness chromium film and a 100 nm thick copper film were laminated in this order by a sputtering method, using a spinner, and then prebaked at 100° C. for 3 minutes using a hot plate. A mask with a line and space (L/S) pattern formed thereon was set to an exposure apparatus "PEM-6M" (manufactured by UNION OPTICAL CO., LTD.) and the sample was contacted to the mask, and then whole radiation exposure was conducted at a light exposure of 500 mJ/cm$^2$ (in terms of a wavelength of 365 nm). After exposure, baking was conducted at 120° C. for 1 minute using a hot plate. Using a spray type development apparatus "AD-2000" (manufactured by Takizawa Sangyo Co., Ltd.), while rotating the substrate at 100 rpm, spray development at a spray pressure of 0.15 MPa for 10 seconds, immersion development for 10 seconds, removal of a developing solution, spray development for 10 seconds, immersion development for 10 seconds, removal of the developing solution and spray development for 10 seconds were conducted, followed by a rinsing treatment with water. As the developing solution, an aqueous 2.38% solution of tetramethylammonium hydroxide was used. After development, a heat treatment was conducted at 280° C. for 60 minutes under a nitrogen atmosphere using INERT OVEN "INL-60" (manufactured by Koyo Thermo System Co., Ltd.) to obtain a film with a desired pattern formed therein made of a dielectric composition. The thickness of the patterned dielectric composition was 5 μm. A line and space (L/S) pattern of the dielectric composition was confirmed using an optical microscope. As a result, it was confirmed that the pattern is free from the residue between patters and pattern peeling up to L/S of 20/20 μm, and satisfactory patterning is conducted.

The paste composition B-1B was applied on an aluminum substrate measuring 6 cm×6 cm in shape and 0.3 mm in thickness using a spinner, prebaked at 100° C. for 3 minutes using a hot plate and then subjected to whole radiation exposure at a light exposure of 500 mJ/cm$^2$ (in terms of a wavelength of 365 nm) using an exposure apparatus "PEM-6M" (manufactured by UNION OPTICAL CO., LTD.). After exposure, baking was conducted at 120° C. for 1 minute using a hot plate. Using a spray type development apparatus "AD-2000" (manufactured by Takizawa Sangyo Co., Ltd.), while rotating the substrate at 100 rpm, spray development for 10 seconds at a spray pressure of 0.15 MPa, immersion development for 10 seconds, removal of a developing solution, spray development for 10 seconds, immersion development for 10 seconds, removal of a developing solution and spray development for 10 seconds were conducted, followed by a rinsing treatment with water. As the developing solution, an aqueous 2.38% solution of tetramethylammonium hydroxide was used. After development, the film was subjected to a heat treatment at 280° C. for 60 minutes under a nitrogen atmosphere using INERT OVEN "INL-60" (manufactured by Koyo Thermo System Co., Ltd.) to obtain a film made of the dielectric composition on the aluminum substrate. Furthermore, a sandwich structure sample was produced in the same manner as described above, this film was evaluated by a high-temperature high-humidity bias test. As a result, it was found that an initial resistance value is $2.3\times10^7\Omega$ (volume resistance value: $4.6\times10^{11}\Omega\cdot cm$), a resistance value after a lapse of time of 200 hours is $2.2\times10^7\Omega$ (volume resistance value: $4.4\times10^{11}\Omega\cdot cm$), and a resistance value after a lapse of time of 500 hours and 1,000 hours is $2.1\times10^7\Omega$ (volume resistance value: $4.1\times10^{11}\Omega\cdot cm$), and that high insulation resistance is maintained until 1,000 hours and satisfactory insulation reliability is achieved.

The paste composition B-1B was applied on an aluminum comb tooth electrode, a copper comb tooth electrode and a silver comb tooth electrode and prebaked at 100° C. for 3 minutes using a hot plate and then subjected to whole radiation exposure at a light exposure of 500 mJ/cm$^2$ (in terms of a wavelength of 365 nm) using an exposure apparatus "PEM-6M" (manufactured by UNION OPTICAL CO., LTD.). After exposure, baking was conducted at 120° C. for 1 minute. After baking, the film was subjected to a heat treatment at 280° C. for 60 minutes under a nitrogen atmosphere using INERT OVEN "INL-60" (manufactured by Koyo Thermo System Co., Ltd.) to obtain a film made of the dielectric composition formed on the comb tooth electrode. When the aluminum comb tooth electrode is used, a resistance value after a lapse of time of 1,000 hours is $7.5\times10^{10}\Omega$. When the copper comb tooth electrode is used, a resistance value after a lapse of time of 1,000 hours is $4.0\times10^9\Omega$. When the silver comb tooth electrode is used, a resistance value after a lapse of time of 1,000 hours is $4.4\times10^{10}\Omega$. As a result, it was found that satisfactory insulation reliability is achieved in any case.

Examples 2 to 17

Each of paste compositions with the compositions shown in Tables 1 to 2 was produced in the same manner as in Example 1 and then dielectric compositions for evaluation were obtained using the same. The evaluation results are shown in Tables 2 to 3. First, a mixture obtained by mixing inorganic particles, a compound A, a silane coupling agent and an organic solvent in the composition was dispersed using a beads mill and the resultant paste compositions were referred to as "B-2A" to "B-17A", respectively. Furthermore, paste compositions obtained by mixing them with a resin solution A were referred to as "B-2B" to "B-17B", respectively.

Example 18

A resin solution A was produced in the same manner as in Example 1. 35 g of THFA, 5 g of a compound A "HOA-MPL", 100 g of inorganic particles "BT-02" (barium titanate secondary particles, manufactured by SAKAI CHEMICAL INDUSTRY CO., LTD., average primary particle diameter: 200 nm) and 27 g of a resin solution A were mixed. A polyethylene sample bottle having a volume of 250 ml was packed with 100 g of zirconia beads (manufactured by NIKKATO CORPORATION, YTZ ball, size: φ0.4 mm) and the above mixed solution was charged therein, followed by rotational mixing at 200 rpm on a ball mill stand for 24 hours. After the dispersion treatment, zirconia beads were separated by a 100 mesh stainless steel sieve and then filtered under pressure using a filter having a retained particle diameter of 2 μm to prepare a paste composition B-18. A filling rate of inorganic particles (amount of inorganic particles based on the entire amount of a solid component of a paste composition) of the paste composition B-18 was 83.7% by weight. The average particle diameter of inorganic particles in the paste composition B-18 was 225 nm, and inorganic particles were dispersed up to the particle diameter close to that of primary particles.

Using the paste composition B-18, a dielectric composition for evaluation was obtained in the same manner as in Example 1. The evaluation results are shown in Tables 2 to 3.

Examples 19 to 34

Each of paste compositions with the compositions shown in Tables 4 to 5 was produced in the same manner as in Example 18, and dielectric compositions for evaluation were obtained using the same. The evaluation results are shown in Tables 5 to 6. The resultant paste compositions were referred to as "B-19" to "B-34", respectively.

Examples 35 to 39

Each of paste compositions with the compositions shown in Tables 4 to 5 was produced in the same manner as in Example 1, and dielectric compositions for evaluation were obtained using the same. The evaluation results are shown in Tables 5 to 6. First, a mixture obtained by mixing inorganic particles, a compound A, a silane coupling agent and an organic solvent in the composition was dispersed using a beads mill and the resultant paste compositions were referred to as "B-35A" to "B-39A", respectively. Furthermore, paste compositions obtained by mixing them with a resin solution A were referred to as "B-35B" to "B-39B", respectively.

Inorganic particles "T-BTO-030R" are barium titanate secondary particles manufactured by TODA KOGYO CORPORATION and the average primary particle diameter is 30 nm. Inorganic particles "BT-05" are barium titanate secondary particles manufactured by SAKAI CHEMICAL INDUSTRY CO., LTD., and the average primary particle diameter is 500 nm.

Examples 40 to 42

Each of paste compositions with the compositions shown in Tables 4 to 5 was produced in the same manner as in Example 18 and then dielectric compositions for evaluation were obtained using the same. The evaluation results are shown in Tables 5 to 6. The resultant paste compositions were referred to as "B-40" to "B-42", respectively.

Inorganic particles "T-BTO-030R" are barium titanate secondary particles manufactured by TODA KOGYO CORPORATION, and the average primary particle diameter is 30 nm.

Example 43

In the same manner as in Example 1, a resin solution A was produced. 35 g of Tetrahydrofurfuryl alcohol, 3 g of a compound A "HOA-MPL", 100 g of inorganic particles "BT-02" (barium titanate secondary particles, manufactured by SAKAI CHEMICAL INDUSTRY CO., LTD., average primary particle diameter: 200 nm) and 27 g of a resin solution A were mixed. A polyethylene sample bottle having a volume of 250 ml was packed with 100 g of zirconia beads (manufactured by NIKKATO CORPORATION, YTZ ball, size: φ0.4 mm) and the above mixed solution was charged therein, followed by rotational mixing at 200 rpm on a ball mill stand for 30 minutes. After the dispersion treatment, zirconia beads were separated by a 100 mesh stainless steel sieve and then filtered under pressure to prepare a paste composition B-43. A filling rate of inorganic particles (amount of inorganic particles based on the entire amount of a solid component of a paste composition) of the paste composition B-43 was 85.1% by weight. The average particle diameter of inorganic particles in the paste composition B-43 was 1,020 nm.

Using the paste composition B-43, a dielectric composition for evaluation was obtained in the same manner as in Example 1. The evaluation results are shown in Tables 5 to 6.

Example 44

A 200 nm thick aluminum film was formed on an alumina substrate measuring 5 cm×5 cm in shape and 0.7 mm in thickness by a sputtering method. The paste composition B-1B was applied on this substrate using a spinner and then baked at 100° C. for 3 minutes using a hot plate. An aluminum film as a base was exposed by wiping off the paste composition by a dust-free paper impregnated with acetone at one end of the substrate after prebaking. The portion where the aluminum film is exposed was used as an electrode at the substrate side.

Using an exposure apparatus "PEM-6M" (manufactured by UNION OPTICAL CO., LTD.), whole radiation exposure was conducted at a light exposure of 500 mJ/cm$^2$ (in terms of a wavelength of 365 nm). After exposure, baking was conducted at 120° C. for 1 minute using a hot plate. Using a spray type development apparatus "AD-2000" (manufactured by Takizawa Sangyo Co., Ltd.), while rotating the substrate at 100 rpm, spray development for 10 seconds at a spray pressure of 0.15 MPa, immersion development for 10 seconds, removal of a developing solution, spray development for 10 seconds, immersion development for 10 seconds, removal of a developing solution and spray development for 10 seconds were conducted, followed by a rinsing treatment with water.

As the developing solution, an aqueous 2.38% solution of tetramethylammonium hydroxide was used. After development, the film was subjected to a heat treatment at 300° C. for 60 minutes under a nitrogen atmosphere using INERT OVEN "INL-60" (manufactured by Koyo Thermo System Co., Ltd.) to obtain a film for a high-temperature high-humidity bias test made of the dielectric composition on the alumina substrate. This film was evaluated by a high-temperature high-humidity bias test. The evaluation results are shown in Table 7.

Examples 45 to 49

In the same manner as in Example 44, except that paste compositions shown in Table 7 were used in place of the paste composition B-1B, films for a high-temperature high-humidity bias test were obtained. The resultant films were evaluated by a high-temperature high-humidity bias test. The evaluation results are shown in Table 7.

Example 50

In the same manner as in Example 1, a resin solution A was prepared. A polyethylene sample bottle having a volume of 250 ml was packed with 100 g of zirconia beads (manufactured by NIKKATO CORPORATION, YTZ ball, size: ϕ0.4 mm) and, furthermore, 35 g of tetrahydrofurfuryl alcohol (THFA), 1 g of a silane coupling agent "KBM503" (manufactured by Shin-Etsu Chemical Co., Ltd.) and 100 g of inorganic particles "BT-02" (barium titanate secondary particles, manufactured by SAKAI CHEMICAL INDUSTRY CO., LTD., average primary particle diameter: 200 nm) were charged therein, followed by rotational dispersion at 200 rpm on a ball mill stand for 6 hours. Then, 3 g of a compound A "HOA-MPE" and 27 g of a resin solution were added, followed by rotational dispersion at 200 rpm on a ball mill stand for 24 hours. After dispersion treatment, zirconia beads were separated by a 100 mesh stainless steel sieve and then filtered under pressure using a filter having a retained particle diameter of 2 μm to obtain a paste composition B-50. A filling rate (amount of inorganic particles based on the entire amount of a solid component of a paste composition) of inorganic particles of the resultant paste compositions B-50 was 84.4% by weight. The average particle diameter of inorganic particles in the paste composition was 215 nm, and inorganic particles were dispersed up to the particle diameter close to that of primary particles.

Using the paste composition B-50, a dielectric composition for evaluation was obtained in the same manner as in Example 1. The evaluation results are shown in Tables 9 to 10.

Regarding the evaluation of developability, not only the evaluation on the copper film in the same manner as in Example 1, but also the evaluation on the silver film was conducted. The paste composition B-50 was applied on a 4 inch alumina substrate on which a 500 nm thick silver film is formed by a sputtering method, using a spinner and then baked at 100° C. for 3 minutes using a hot plate. A mask with a line and space (L/S) pattern formed thereon was set to an exposure apparatus "PEM-6M" (manufactured by UNION OPTICAL CO., LTD.) and the sample was contacted to the mask, and then whole radiation exposure was conducted at a light exposure of 500 mJ/cm² (in terms of a wavelength of 365 nm). After exposure, baking was conducted at 120° C. for 1 minute using a hot plate. Using a spray type development apparatus "AD-2000" (manufactured by Takizawa Sangyo Co., Ltd.), while rotating the substrate at 100 rpm, spray development at a spray pressure of 0.25 MPa for 10 seconds, immersion development for 10 seconds, removal of a developing solution, spray development for 10 seconds, immersion development for 10 seconds, removal of the developing solution and spray development for 10 seconds were conducted, followed by a rinsing treatment with water. As the developing solution, a developing solution prepared by adding 3 parts by weight of a surfactant "EMULGEN® A60" (manufactured by Kao Corporation) to 100 parts by weight of an aqueous 2.38% solution of tetramethylammonium hydroxide was used. After development, a heat treatment was conducted at 280° C. for 60 minutes under a nitrogen atmosphere using INERT OVEN "INL-60" (manufactured by Koyo Thermo System Co., Ltd.) to obtain a film with a desired pattern formed therein made of a dielectric composition. The thickness of the patterned dielectric composition was 5 μm. A line and space (L/S) pattern of the dielectric composition was confirmed using an optical microscope. As a result, it was confirmed that the pattern is free from the residue between patterns and pattern peeling up to L/S of 20/20 μm, and satisfactory patterning is conducted.

Examples 51 to 53

Paste compositions with the compositions shown in Tables 8 to 9 were prepared in the same manner as in Example 50, and dielectric compositions for evaluation were obtained using the same. The evaluation results are shown in Tables 9 to 10. The resultant paste compositions are referred to as "B-51" to "B-53", respectively. The organic solvent "γ-BL" is abbreviation of γ-butyrolactone, inorganic particles "ST-03" are strontium titanate secondary particles manufactured by SAKAI CHEMICAL INDUSTRY CO., LTD., and the average primary particle diameter is 300 nm.

Example 54

In the same manner as in Example 1, a polymer A was produced.

Next, a solution prepared by dissolving 10 g of a polymer A, 1.4 g of an oxime-based UV-active polymerization promoter "OXE02" (manufactured by Chiba Specialty Chemicals K.K.), 0.006 g of 2-nitroso-1-naphthol as a polymerization inhibitor, 1.4 g of a thermally crosslinkable compound "NIKALAC MX-270" (manufactured by Sanwa Chemical Co., Ltd.), 1.4 g of "NIKALAC MW-100LM" (manufactured by Sanwa Chemical Co., Ltd.), 4.3 g of "PDBE-250" (manufactured by NOF CORPORATION, a compound having a polymerizable unsaturated double bond), 1.4 g of "Karenz MOI-BP" (manufactured by Showa Denko K.K.) and 1.4 g of dimethyloltricyclodecane diacrylate (a compound having a polymerizable unsaturated double bond) in 7.4 g of diacetone alcohol and 10.9 g of ethyl lactate was stirred and degassed and then filtered under pressure using a filter having a retained particle diameter of 2 μm to obtain a resin solution A-2.

In a polyethylene container having a volume of 250 ml, 35 g of tetrahydrofurfuryl alcohol (THFA), 1 g of a silane coupling agent "KBM503" (manufactured by Shin-Etsu Chemical Co., Ltd.), 100 g of inorganic particles "BT-02" (barium titanate secondary particles, manufactured by SAKAI CHEMICAL INDUSTRY CO., LTD., average primary particle diameter: 200 nm) and 900 g of zirconia beads having an average particle diameter of 0.4 mm were charged and then rotationally dispersed at 200 rpm on a ball mill stand for 6 hours. Furthermore, 3 g of a compound A "HOA-MPE" and 27 g of a resin solution A-2 were added, followed by rotational dispersion at 200 rpm on a ball mill stand for 24 hours. After the dispersion treatment, zirconia beads were separated by a 100 mesh stainless steel sieve and then filtered under pressure using a filter having a retained particle diameter of 2 μm to obtain a paste composition B-54. A filling rate (amount of inorganic particles based on the entire amount of a solid component of a paste composition) of inorganic particles of the resultant paste compositions B-54 was 84.4% by weight. The average particle diameter of inorganic particles in the paste composition was 232 nm, and inorganic particles were dispersed up to the particle diameter close to that of primary particles.

The paste composition B-54 was applied on an aluminum substrate measuring 6 cm×6 cm in shape and 0.3 mm in thickness using a spinner and then baked at 120° C. for 3 minutes using a hot plate, subjected to whole radiation exposure at a light exposure of 150 mJ/cm$^2$ (in terms of a wavelength of 365 nm) using an exposure apparatus "PEM-6M" (manufactured by UNION OPTICAL CO., LTD.) and then subjected to a heat treatment at 140° C. for 60 minutes, then at 350° C. for 60 minutes under a nitrogen atmosphere using INERT OVEN "INL-60" (manufactured by Koyo Thermo System Co., Ltd.) to obtain a film made of the dielectric composition on the aluminum substrate. A dielectric constant film at a measuring frequency of 1 MHz was 43, and a dielectric dissipation factor was 0.02.

Next, the paste composition B-54 was applied on a 4 inch silicon wafer on which a 10 nm thick chromium film and a 100 nm thick copper film were laminated in this order by a sputtering method, using a spinner and then baked at 120° C. for 3 minutes using a hot plate. "A mask with a line and space (L/S) pattern formed thereon was set to an exposure apparatus "PEM-6M" (manufactured by UNION OPTICAL CO., LTD.) and the sample was contacted to the mask, and then whole radiation exposure was conducted at a light exposure of 150 mJ/cm$^2$ (in terms of a wavelength of 365 nm). Using a spray type development apparatus "AD-2000" (manufactured by Takizawa Sangyo Co., Ltd.), while rotating the substrate at 100 rpm, spray development at a spray pressure of 0.15 MPa for 10 seconds, immersion development for 150 seconds, removal of a developing solution, spray development for 10 seconds, immersion development for 150 seconds, removal of the developing solution and spray development for 10 seconds were conducted, followed by a rinsing treatment with water. As the developing solution, an aqueous 2.38% solution of tetramethylammonium hydroxide was used. After development, a heat treatment was conducted at 140° C. for 60 minutes, then at 350° C. for 60 minutes under a nitrogen atmosphere using INERT OVEN "INL-60" (manufactured by Koyo Thermo System Co., Ltd.) to obtain a film with a desired pattern formed therein made of a dielectric composition. The thickness of the patterned dielectric composition was 5 μm. A line and space (L/S) pattern of the dielectric composition was confirmed using an optical microscope. As a result, it was confirmed that the pattern is free from the residue between patterns and pattern peeling up to L/S of 25/25 μm, and satisfactory patterning is conducted.

The paste composition B-54 was applied on an aluminum substrate measuring 6 cm×6 cm in shape and 0.3 mm in thickness using a spinner, prebaked at 120° C. for 3 minutes using a hot plate and then subjected to whole radiation exposure at a light exposure of 150 mJ/cm$^2$ (in terms of a wavelength of 365 nm) using an exposure apparatus "PEM-6M" (manufactured by UNION OPTICAL CO., LTD.). Using a spray type development apparatus "AD-2000" (manufactured by Takizawa Sangyo Co., Ltd.), while rotating the substrate at 100 rpm, spray development for 10 seconds at a spray pressure of 0.15 MPa, immersion development for 150 seconds, removal of a developing solution, spray development for 10 seconds, immersion development for 150 seconds, removal of the developing solution and spray development for 10 seconds were repeated, followed by a rinsing treatment with water. As the developing solution, an aqueous 2.38% solution of tetramethylammonium hydroxide was used. After development, the film was subjected to a heat treatment at 140° C. for 60 minutes, then at 350° C. for 60 minutes under a nitrogen atmosphere using INERT OVEN "INL-60" (manufactured by Koyo Thermo System Co., Ltd.) to obtain a film made of the dielectric composition on the aluminum substrate. This film was evaluated by a high-temperature high-humidity bias test.

The paste composition B-54 was applied on an aluminum comb tooth electrode, a copper comb tooth electrode and a silver comb tooth electrode, prebaked at 120° C. for 3 minutes using a hot plate and then subjected to whole radiation exposure at a light exposure of 500 mJ/cm$^2$ (in terms of a wavelength of 365 nm) using an exposure apparatus "PEM-6M" (manufactured by UNION OPTICAL CO., LTD.). After exposure, the film was subjected to a heat treatment at 140° C. for 60 minutes, then at 350° C. for 60 minutes under a nitrogen atmosphere, using INERT OVEN "INL-60" (manufactured by Koyo Thermo System Co., Ltd.) to obtain a film made of the dielectric composition formed on the comb tooth electrode. The film formed on the comb tooth electrode was evaluated by a high-temperature high-humidity bias test. The evaluation results are shown in Tables 9 to 10.

Comparative Example 1

Each of paste compositions with the compositions shown in Tables 11 to 12 was produced in the same manner as in Example 1, and dielectric compositions for evaluation were obtained using the same. The evaluation results are shown in Tables 12 to 13. First, a mixture of inorganic particles, a dispersing agent and an organic solvent was dispersed using a beads mill and the resultant paste composition was referred to as "C-1A". Furthermore, a paste composition obtained by mixing them with a resin solution A was referred to as "C-1B". The dispersing agent "BYK-W9010" is manufactured by BYK Japan KK and is a phosphoric acid ester compound having no polymerizable group.

Comparative Example 2

Paste compositions with the compositions shown in Tables 11 to 12 were prepared in the same manner as in Example 18, and dielectric compositions for evaluation were obtained using the same. The evaluation results are shown in Tables 12 to 13. The resultant paste composition was referred to as "C-2". The dispersing agent "BYK-W9010" is manufactured by BYK Japan KK and is a phosphoric acid ester compound having no polymerizable group.

TABLE 1

| | | Composition of past composition | | | | | | | | | | |
|---|---|---|---|---|---|---|---|---|---|---|---|---|
| | Name of paste composition | Inorganic particles | | Compound A | | | | Silane coupling agent | | Organic solvent | | Resin |
| | | Material | Parts by weight | Material | Parts by weight | Material | Parts by weight | Material | Parts by weight | Material | Parts by weight | Material | Parts by weight |
| Example 1 | B-1B | BT02 | 100 | HOA-MPL | 5 | — | — | — | — | THFA | 35 | Resin solution A | 27 |
| Example 2 | B-2B | BT02 | 100 | HOA-MPL | 5 | — | — | KBM503 | 2 | THFA | 35 | Resin solution A | 27 |
| Example 3 | B-3B | BT02 | 100 | HOA-MPL | 3 | — | — | — | — | THFA | 35 | Resin solution A | 27 |
| Example 4 | B-4B | BT02 | 100 | HOA-MPL | 3 | — | — | KBM503 | 2 | THFA | 35 | Resin solution A | 27 |
| Example 5 | B-5B | BT02 | 100 | HOA-MPL | 3 | HOA-MPE | 2 | — | — | THFA | 35 | Resin solution A | 27 |
| Example 6 | B-6B | BT02 | 100 | HOA-MPL | 3 | HOA-MPE | 1 | — | — | THFA | 35 | Resin solution A | 27 |
| Example 7 | B-7B | BT02 | 100 | HOA-MPL | 2 | HOA-MPE | 2 | — | — | THFA | 35 | Resin solution A | 27 |
| Example 8 | B-8B | BT02 | 100 | HOA-MPL | 2 | HOA-MPE | 1 | — | — | THFA | 35 | Resin solution A | 27 |
| Example 9 | B-9B | BT02 | 100 | HOA-MPL | 2 | HOA-MPE | 1 | KBM503 | 2 | THFA | 35 | Resin solution A | 27 |
| Example 10 | B-10B | BT02 | 100 | HOA-MPL | 2 | HOA-MPE | 3 | — | — | THFA | 35 | Resin solution A | 27 |
| Example 11 | B-11B | BT02 | 100 | HOA-MPL | 1 | HOA-MPE | 3 | — | — | THFA | 35 | Resin solution A | 27 |
| Example 12 | B-12B | BT02 | 100 | HOA-MPL | 1 | HOA-MPE | 3 | KBM503 | 2 | THFA | 35 | Resin solution A | 27 |
| Example 13 | B-13B | BT02 | 100 | HOA-MPL | 1 | HOA-MPE | 2 | KBM503 | 2 | THFA | 35 | Resin solution A | 27 |
| Example 14 | B-14B | BT02 | 100 | HOA-MPE | 5 | — | — | KBM503 | 2 | THFA | 35 | Resin solution A | 27 |
| Example 15 | B-15B | BT02 | 100 | HOA-MPE | 3 | — | — | KBM503 | 2 | THFA | 35 | Resin solution A | 27 |
| Example 16 | B-16B | BT02 | 100 | HOA-HH | 5 | — | — | KBM503 | 2 | THFA | 35 | Resin solution A | 27 |
| Example 17 | B-17B | BT02 | 100 | HOA-HH | 3 | — | — | KBM503 | 2 | THFA | 35 | Resin solution A | 27 |

TABLE 2

| | Paste composition | | | | |
|---|---|---|---|---|---|
| | Dispersion conditions | | | Filling rate of inorganic particles (% by weight) | Average particle diameter of inorganic particles in paste composition (nm) |
| | Dispersion technique | Diameter of beads | Time | | |
| Example 1 | Beads mill | φ0.05 mm | 2 hours | 83.7 | 210 |
| Example 2 | Beads mill | φ0.05 mm | 2 hours | 82.3 | 208 |
| Example 3 | Beads mill | φ0.05 mm | 2 hours | 85.1 | 212 |
| Example 4 | Beads mill | φ0.05 mm | 2 hours | 83.7 | 213 |
| Example 5 | Beads mill | φ0.05 mm | 2 hours | 83.7 | 211 |
| Example 6 | Beads mill | φ0.05 mm | 2 hours | 84.4 | 213 |

TABLE 2-continued

| | Paste composition | | | | |
|---|---|---|---|---|---|
| | Dispersion conditions | | | Filling rate of inorganic particles (% by weight) | Average particle diameter of inorganic particles in paste composition (nm) |
| | Dispersion technique | Diameter of beads | Time | | |
| Example 7 | Beads mill | φ0.05 mm | 2 hours | 84.4 | 210 |
| Example 8 | Beads mill | φ0.05 mm | 2 hours | 85.1 | 209 |
| Example 9 | Beads mill | φ0.05 mm | 2 hours | 83.7 | 208 |
| Example 10 | Beads mill | φ0.05 mm | 2 hours | 83.7 | 210 |
| Example 11 | Beads mill | φ0.05 mm | 2 hours | 84.4 | 214 |
| Example 12 | Beads mill | φ0.05 mm | 2 hours | 83 | 211 |
| Example 13 | Beads mill | φ0.05 mm | 2 hours | 83.7 | 216 |
| Example 14 | Beads mill | φ0.05 mm | 2 hours | 82.3 | 218 |
| Example 15 | Beads mill | φ0.05 mm | 2 hours | 83.7 | 221 |
| Example 16 | Beads mill | φ0.05 mm | 2 hours | 82.3 | 219 |
| Example 17 | Beads mill | φ0.05 mm | 2 hours | 83.7 | 218 |

TABLE 3

Evaluation results of dielectric composition

| | Dielectric constant (Relative dielectric constant) | Developable L/S (μm) | Substrate in high-temperature high-humidity bias test | Resistance value in high-temperature high-humidity bias test (Ω) | | | | | | |
|---|---|---|---|---|---|---|---|---|---|---|
| | | | | Sandwich structure (Al electrode) | | | | Al comb tooth electrode | Cu comb tooth electrode | Ag comb tooth electrode |
| | | | | Initial | After 200 hours | After 500 hours | After 1,000 hours | After 1,000 hours | After 1,000 hours | After 1,000 hours |
| Example 1 | 33 | 20/20 | Aluminum | $2.3 \times 10^7$ | $2.2 \times 10^7$ | $2.1 \times 10^7$ | $2.1 \times 10^7$ | $7.5 \times 10^{10}$ | $4.0 \times 10^9$ | $4.4 \times 10^{10}$ |
| Example 2 | 31 | 15/15 | Aluminum | $2.5 \times 10^7$ | $2.4 \times 10^7$ | $2.4 \times 10^7$ | $2.3 \times 10^7$ | $7.7 \times 10^{10}$ | $4.2 \times 10^9$ | $4.4 \times 10^{10}$ |
| Example 3 | 35 | 20/20 | Aluminum | $1.8 \times 10^7$ | $1.7 \times 10^7$ | $1.6 \times 10^7$ | $1.6 \times 10^7$ | $7.1 \times 10^{10}$ | $1.5 \times 10^9$ | $1.8 \times 10^{10}$ |
| Example 4 | 34 | 15/15 | Aluminum | $2.0 \times 10^7$ | $2.0 \times 10^7$ | $1.9 \times 10^7$ | $1.9 \times 10^7$ | $7.4 \times 10^{10}$ | $4.0 \times 10^9$ | $2.3 \times 10^{10}$ |
| Example 5 | 34 | 15/15 | Aluminum | $2.2 \times 10^7$ | $2.2 \times 10^7$ | $2.1 \times 10^7$ | $2.0 \times 10^7$ | $7.3 \times 10^{10}$ | $4.2 \times 10^9$ | $4.5 \times 10^{10}$ |
| Example 6 | 36 | 15/15 | Aluminum | $2.2 \times 10^7$ | $2.1 \times 10^7$ | $2.0 \times 10^7$ | $2.0 \times 10^7$ | $7.3 \times 10^{10}$ | $3.9 \times 10^9$ | $4.0 \times 10^{10}$ |
| Example 7 | 35 | 15/15 | Aluminum | $1.5 \times 10^7$ | $1.4 \times 10^7$ | $1.3 \times 10^7$ | $1.3 \times 10^7$ | $5.7 \times 10^{10}$ | $3.1 \times 10^9$ | $2.8 \times 10^9$ |
| Example 8 | 36 | 15/15 | Aluminum | $1.0 \times 10^7$ | $9.5 \times 10^6$ | $9.1 \times 10^6$ | $8.7 \times 10^6$ | $1.1 \times 10^{10}$ | $9.9 \times 10^8$ | $9.3 \times 10^8$ |
| Example 9 | 33 | 15/15 | Aluminum | $1.2 \times 10^7$ | $1.1 \times 10^7$ | $1.0 \times 10^7$ | $1.0 \times 10^7$ | $2.1 \times 10^{10}$ | $2.5 \times 10^9$ | $1.4 \times 10^{10}$ |
| Example 10 | 33 | 15/15 | Aluminum | $2.1 \times 10^7$ | $2.0 \times 10^7$ | $2.0 \times 10^7$ | $1.9 \times 10^7$ | $4.0 \times 10^{10}$ | $3.8 \times 10^9$ | $3.8 \times 10^9$ |
| Example 11 | 34 | 25/25 | Aluminum | $8.7 \times 10^6$ | $8.3 \times 10^6$ | $7.9 \times 10^6$ | $7.5 \times 10^6$ | $8.9 \times 10^9$ | $9.8 \times 10^8$ | $8.9 \times 10^8$ |
| Example 12 | 32 | 15/15 | Aluminum | $9.1 \times 10^6$ | $8.4 \times 10^6$ | $7.8 \times 10^6$ | $7.2 \times 10^6$ | $8.6 \times 10^{10}$ | $8.0 \times 10^8$ | $8.2 \times 10^8$ |
| Example 13 | 34 | 15/15 | Aluminum | $7.9 \times 10^6$ | $7.3 \times 10^6$ | $6.6 \times 10^6$ | $6.3 \times 10^6$ | $7.1 \times 10^9$ | $5.4 \times 10^9$ | $6.0 \times 10^8$ |
| Example 14 | 31 | 15/15 | Aluminum | $6.5 \times 10^6$ | $6.1 \times 10^6$ | $5.8 \times 10^6$ | $5.5 \times 10^6$ | $4.2 \times 10^{10}$ | $3.1 \times 10^9$ | $3.4 \times 10^9$ |
| Example 15 | 34 | 15/15 | Aluminum | $6.5 \times 10^6$ | $6.0 \times 10^6$ | $5.9 \times 10^6$ | $5.4 \times 10^6$ | $4.5 \times 10^{10}$ | $2.0 \times 10^9$ | $2.3 \times 10^{10}$ |
| Example 16 | 32 | 15/15 | Aluminum | $6.3 \times 10^6$ | $5.9 \times 10^6$ | $5.6 \times 10^6$ | $5.3 \times 10^6$ | $4.5 \times 10^{10}$ | $3.0 \times 10^9$ | $2.9 \times 10^{10}$ |
| Example 17 | 35 | 15/15 | Aluminum | $6.1 \times 10^6$ | $5.7 \times 10^6$ | $5.4 \times 10^6$ | $5.1 \times 10^6$ | $3.9 \times 10^{10}$ | $3.0 \times 10^9$ | $2.6 \times 10^{10}$ |

TABLE 4

Composition of past composition

| Name of paste composition | Inorganic particles | | Compound A | | | | Silane coupling agent | | Organic solvent | | Resin | |
|---|---|---|---|---|---|---|---|---|---|---|---|---|
| | Material | Parts by weight | Material | Parts by weight | Material | Parts by weight | Material | Parts by weight | Material | Parts by weight | Material | Parts by weight |
| Example 18 | B-18 | BT02 | 100 | HOA-MPL | 5 | — | — | — | — | THFA | 35 | Resin solution A | 27 |
| Example 19 | B-19 | BT02 | 100 | HOA-MPL | 5 | — | — | KBM503 | 2 | THFA | 35 | Resin solution A | 27 |
| Example 20 | B-20 | BT02 | 100 | HOA-MPL | 3 | — | — | — | — | THFA | 35 | Resin solution A | 27 |
| Example 21 | B-21 | BT02 | 100 | HOA-MPL | 3 | — | — | KBM503 | 2 | THFA | 35 | Resin solution A | 27 |

TABLE 4-continued

| | | Composition of past composition | | | | | | | | | | |
|---|---|---|---|---|---|---|---|---|---|---|---|---|
| | Name of paste composition | Inorganic particles | | Compound A | | | | Silane coupling agent | | Organic solvent | | Resin |
| | | Material | Parts by weight | Material | Parts by weight | Material | Parts by weight | Material | Parts by weight | Material | Parts by weight | Material | Parts by weight |
| Example 22 | B-22 | BT02 | 100 | HOA-MPL | 3 | HOA-MPE | 2 | — | — | THFA | 35 | Resin solution A | 27 |
| Example 23 | B-23 | BT02 | 100 | HOA-MPL | 3 | HOA-MPE | 1 | — | — | THFA | 35 | Resin solution A | 27 |
| Example 24 | B-24 | BT02 | 100 | HOA-MPL | 2 | HOA-MPE | 2 | — | — | THFA | 35 | Resin solution A | 27 |
| Example 25 | B-25 | BT02 | 100 | HOA-MPL | 2 | HOA-MPE | 1 | — | — | THFA | 35 | Resin solution A | 27 |
| Example 26 | B-26 | BT02 | 100 | HOA-MPL | 2 | HOA-MPE | 1 | KBM503 | 2 | THFA | 35 | Resin solution A | 27 |
| Example 27 | B-27 | BT02 | 100 | HOA-MPL | 2 | HOA-MPE | 3 | — | — | THFA | 35 | Resin solution A | 27 |
| Example 28 | B-28 | BT02 | 100 | HOA-MPL | 1 | HOA-MPE | 3 | — | — | THFA | 35 | Resin solution A | 27 |
| Example 29 | B-29 | BT02 | 100 | HOA-MPL | 1 | HOA-MPE | 3 | KBM503 | 2 | THFA | 35 | Resin solution A | 27 |
| Example 30 | B-30 | BT02 | 100 | HOA-MPL | 1 | HOA-MPE | 2 | KBM503 | 2 | THFA | 35 | Resin solution A | 27 |
| Example 31 | B-31 | BT02 | 100 | HOA-MPE | 5 | — | — | KBM503 | 2 | THFA | 35 | Resin solution A | 27 |
| Example 32 | B-32 | BT02 | 100 | HOA-MPE | 3 | — | — | KBM503 | 2 | THFA | 35 | Resin solution A | 27 |
| Example 33 | B-33 | BT02 | 100 | HOA-HH | 5 | — | — | KBM503 | 2 | THFA | 35 | Resin solution A | 27 |
| Example 34 | B-34 | BT02 | 100 | HOA-HH | 3 | — | — | KBM503 | 2 | THFA | 35 | Resin solution A | 27 |
| Example 35 | B-35 | T-BTO-030R | 100 | HOA-MPL | 5 | — | — | — | — | THFA | 35 | Resin solution A | 27 |
| Example 36 | B-36 | T-BTO-030R | 100 | HOA-MPL | 5 | — | — | KBM503 | 2 | THFA | 35 | Resin solution A | 27 |
| Example 37 | B-37 | T-BTO-030R | 100 | HOA-MPL | 3 | HOA-MPE | 2 | — | — | THFA | 35 | Resin solution A | 27 |
| Example 38 | B-38 | BT05 | 100 | HOA-MPL | 5 | — | — | — | — | THFA | 35 | Resin solution A | 27 |
| Example 39 | B-39 | BT05 | 100 | HOA-MPL | 5 | — | — | KBM503 | 2 | THFA | 35 | Resin solution A | 27 |
| Example 40 | B-40 | T-BTO-030R | 100 | HOA-MPL | 5 | — | — | — | — | THFA | 35 | Resin solution A | 27 |
| Example 41 | B-41 | T-BTO-030R | 100 | HOA-MPL | 5 | — | — | KBM503 | 2 | THFA | 35 | Resin solution A | 27 |
| Example 42 | B-42 | T-BTO-030R | 100 | HOA-MPL | 3 | HOA-MPE | 2 | — | — | THFA | 35 | Resin solution A | 27 |
| Example 43 | B-43 | BT02 | 100 | HOA-MPL | 3 | — | — | — | — | THFA | 35 | Resin solution A | 27 |

TABLE 5

| | Paste composition | | | | Average particle diameter of inorganic particles in paste composition (nm) |
|---|---|---|---|---|---|
| | Dispersion conditions | | | Filling rate of inorganic particles (% by weight) | |
| | Dispersion technique | Diameter of beads | Time | | |
| Example 18 | Ball mill | φ0.4 mm | 24 hours | 83.7 | 225 |
| Example 19 | Ball mill | φ0.4 mm | 24 hours | 82.3 | 221 |
| Example 20 | Ball mill | φ0.4 mm | 24 hours | 85.1 | 220 |
| Example 21 | Ball mill | φ0.4 mm | 24 hours | 83.7 | 223 |
| Example 22 | Ball mill | φ0.4 mm | 24 hours | 83.7 | 225 |
| Example 23 | Ball mill | φ0.4 mm | 24 hours | 84.4 | 224 |
| Example 24 | Ball mill | φ0.4 mm | 24 hours | 84.4 | 219 |
| Example 25 | Ball mill | φ0.4 mm | 24 hours | 85.1 | 228 |
| Example 26 | Ball mill | φ0.4 mm | 24 hours | 83.7 | 218 |
| Example 27 | Ball mill | φ0.4 mm | 24 hours | 83.7 | 217 |
| Example 28 | Ball mill | φ0.4 mm | 24 hours | 84.4 | 221 |
| Example 29 | Ball mill | φ0.4 mm | 24 hours | 83 | 223 |
| Example 30 | Ball mill | φ0.4 mm | 24 hours | 83.7 | 220 |
| Example 31 | Ball mill | φ0.4 mm | 24 hours | 82.3 | 228 |
| Example 32 | Ball mill | φ0.4 mm | 24 hours | 83.7 | 231 |
| Example 33 | Ball mill | φ0.4 mm | 24 hours | 82.3 | 230 |
| Example 34 | Ball mill | φ0.4 mm | 24 hours | 83.7 | 229 |
| Example 35 | Beads mill | φ0.05 mm | 2 hours | 83.7 | 56 |
| Example 36 | Beads mill | φ0.05 mm | 2 hours | 82.3 | 57 |
| Example 37 | Beads mill | φ0.05 mm | 2 hours | 83.7 | 58 |
| Example 38 | Beads mill | φ0.05 mm | 2 hours | 83.7 | 549 |
| Example 39 | Beads mill | φ0.05 mm | 2 hours | 82.3 | 545 |
| Example 40 | Ball mill | φ0.4 mm | 24 hours | 83.7 | 154 |
| Example 41 | Ball mill | φ0.4 mm | 24 hours | 82.3 | 160 |
| Example 42 | Ball mill | φ0.4 mm | 24 hours | 83.7 | 155 |
| Example 43 | Ball mill | φ0.4 mm | 30 hours | 85.1 | 1020 |

TABLE 6

| | Evaluation results of dielectric composition | | | | | | | | |
|---|---|---|---|---|---|---|---|---|---|
| | | | | Resistance value in high-temperature high-humidity bias test (Ω) | | | | | |
| | Dielectric constant (Relative dielectric constant) | Developable L/S (μm) | Substrate in high-temperature high-humidity bias test | Sandwich structure (Al electrode) | | | | Al comb tooth electrode | Cu comb tooth electrode | Ag comb tooth electrode |
| | | | | Initial | After 200 hours | After 500 hours | After 1,000 hours | After 1,000 hours | After 1,000 hours | After 1,000 hours |
| Example 18 | 43 | 20/20 | Aluminum | $2.1 \times 10^7$ | $2.0 \times 10^7$ | $2.0 \times 10^7$ | $1.9 \times 10^7$ | $7.3 \times 10^{10}$ | $3.8 \times 10^9$ | $4.1 \times 10^{10}$ |
| Example 19 | 41 | 15/15 | Aluminum | $2.2 \times 10^7$ | $2.1 \times 10^7$ | $2.1 \times 10^7$ | $2.0 \times 10^7$ | $7.6 \times 10^{10}$ | $4.2 \times 10^9$ | $4.0 \times 10^{10}$ |
| Example 20 | 45 | 20/20 | Aluminum | $1.7 \times 10^7$ | $1.6 \times 10^7$ | $1.5 \times 10^7$ | $1.5 \times 10^7$ | $6.6 \times 10^{10}$ | $1.2 \times 10^9$ | $1.8 \times 10^{10}$ |
| Example 21 | 42 | 15/15 | Aluminum | $1.8 \times 10^7$ | $1.8 \times 10^7$ | $1.7 \times 10^7$ | $1.6 \times 10^7$ | $7.1 \times 10^{10}$ | $3.8 \times 10^9$ | $2.1 \times 10^{10}$ |
| Example 22 | 42 | 15/15 | Aluminum | $2.0 \times 10^7$ | $1.9 \times 10^7$ | $1.8 \times 10^7$ | $1.7 \times 10^7$ | $6.9 \times 10^{10}$ | $5.6 \times 10^9$ | $3.9 \times 10^{10}$ |
| Example 23 | 44 | 15/15 | Aluminum | $1.9 \times 10^7$ | $1.8 \times 10^7$ | $1.8 \times 10^7$ | $1.7 \times 10^7$ | $7.0 \times 10^{10}$ | $3.1 \times 10^9$ | $3.5 \times 10^{10}$ |
| Example 24 | 44 | 15/15 | Aluminum | $1.4 \times 10^7$ | $1.3 \times 10^7$ | $1.2 \times 10^7$ | $1.2 \times 10^7$ | $5.1 \times 10^{10}$ | $1.8 \times 10^9$ | $2.6 \times 10^{10}$ |
| Example 25 | 45 | 15/15 | Aluminum | $9.1 \times 10^6$ | $8.4 \times 10^6$ | $7.8 \times 10^6$ | $7.3 \times 10^6$ | $9.6 \times 10^9$ | $7.2 \times 10^8$ | $9.1 \times 10^9$ |
| Example 26 | 42 | 15/15 | Aluminum | $1.1 \times 10^7$ | $1.0 \times 10^7$ | $9.6 \times 10^6$ | $8.9 \times 10^7$ | $1.6 \times 10^{11}$ | $2.5 \times 10^{10}$ | $1.6 \times 10^{10}$ |
| Example 27 | 43 | 15/15 | Aluminum | $1.9 \times 10^7$ | $1.9 \times 10^7$ | $1.8 \times 10^7$ | $1.7 \times 10^7$ | $3.5 \times 10^{10}$ | $3.5 \times 10^9$ | $3.2 \times 10^{10}$ |
| Example 28 | 45 | 25/25 | Aluminum | $7.9 \times 10^6$ | $7.3 \times 10^6$ | $6.8 \times 10^6$ | $6.5 \times 10^6$ | $7.6 \times 10^9$ | $8.6 \times 10^8$ | $7.9 \times 10^9$ |
| Example 29 | 41 | 15/15 | Aluminum | $8.5 \times 10^6$ | $8.0 \times 10^6$ | $7.6 \times 10^6$ | $7.2 \times 10^6$ | $8.4 \times 10^{10}$ | $9.9 \times 10^8$ | $8.2 \times 10^9$ |
| Example 30 | 42 | 15/15 | Aluminum | $6.7 \times 10^6$ | $6.2 \times 10^6$ | $5.7 \times 10^6$ | $5.5 \times 10^6$ | $7.1 \times 10^9$ | $4.9 \times 10^8$ | $4.0 \times 10^9$ |
| Example 31 | 40 | 15/15 | Aluminum | $5.8 \times 10^6$ | $5.4 \times 10^6$ | $5.1 \times 10^6$ | $4.8 \times 10^6$ | $4.0 \times 10^{10}$ | $2.8 \times 10^9$ | $3.1 \times 10^9$ |
| Example 32 | 43 | 15/15 | Aluminum | $5.9 \times 10^6$ | $5.6 \times 10^6$ | $5.3 \times 10^6$ | $5.0 \times 10^6$ | $4.9 \times 10^{10}$ | $3.3 \times 10^9$ | $2.5 \times 10^{10}$ |
| Example 33 | 41 | 15/15 | Aluminum | $5.4 \times 10^6$ | $5.1 \times 10^6$ | $4.9 \times 10^6$ | $4.6 \times 10^6$ | $4.5 \times 10^{10}$ | $3.0 \times 10^9$ | $2.9 \times 10^{10}$ |
| Example 34 | 42 | 15/15 | Aluminum | $5.1 \times 10^6$ | $4.8 \times 10^6$ | $4.5 \times 10^6$ | $4.3 \times 10^6$ | $4.3 \times 10^{10}$ | $2.9 \times 10^9$ | $2.8 \times 10^{10}$ |
| Example 35 | 23 | 15/15 | Aluminum | $8.5 \times 10^7$ | $8.1 \times 10^7$ | $7.7 \times 10^7$ | $7.3 \times 10^7$ | $2.6 \times 10^{11}$ | $7.2 \times 10^{10}$ | $8.2 \times 10^{10}$ |
| Example 36 | 22 | 15/15 | Aluminum | $9.7 \times 10^7$ | $9.2 \times 10^7$ | $8.7 \times 10^7$ | $8.1 \times 10^7$ | $3.2 \times 10^{11}$ | $9.8 \times 10^{10}$ | $8.9 \times 10^{10}$ |
| Example 37 | 23 | 15/15 | Aluminum | $7.7 \times 10^7$ | $7.3 \times 10^7$ | $7.0 \times 10^7$ | $6.6 \times 10^7$ | $1.2 \times 10^{11}$ | $5.5 \times 10^9$ | $7.9 \times 10^{10}$ |
| Example 38 | 45 | 40/40 | Aluminum | $1.9 \times 10^7$ | $1.9 \times 10^7$ | $1.8 \times 10^7$ | $1.7 \times 10^7$ | $7.3 \times 10^{10}$ | $3.8 \times 10^9$ | $4.1 \times 10^{10}$ |
| Example 39 | 44 | 30/30 | Aluminum | $1.9 \times 10^7$ | $1.9 \times 10^7$ | $1.8 \times 10^7$ | $1.7 \times 10^7$ | $7.6 \times 10^{10}$ | $4.2 \times 10^9$ | $4.0 \times 10^{10}$ |
| Example 40 | 28 | 15/15 | Aluminum | $6.1 \times 10^7$ | $5.8 \times 10^7$ | $5.4 \times 10^7$ | $5.1 \times 10^7$ | $2.2 \times 10^{11}$ | $3.3 \times 10^9$ | $2.3 \times 10^{10}$ |
| Example 41 | 27 | 15/15 | Aluminum | $7.5 \times 10^7$ | $7.3 \times 10^7$ | $6.9 \times 10^7$ | $6.6 \times 10^7$ | $1.4 \times 10^{11}$ | $8.5 \times 10^8$ | $8.1 \times 10^{10}$ |
| Example 42 | 29 | 15/15 | Aluminum | $5.6 \times 10^7$ | $5.4 \times 10^7$ | $5.1 \times 10^7$ | $4.8 \times 10^7$ | $9.7 \times 10^{10}$ | $3.3 \times 10^9$ | $3.2 \times 10^{10}$ |
| Example 43 | 45 | 100/100 | Aluminum | $1.3 \times 10^7$ | $1.2 \times 10^7$ | $1.2 \times 10^7$ | $1.2 \times 10^7$ | $6.7 \times 10^{10}$ | $1.8 \times 10^9$ | $9.9 \times 10^9$ |

TABLE 7

Evaluation results of dielectric composition

Resistance value in high-temperature high-humidity bias test (Ω)

| | Name of paste composition | Substrate in high-temperature high-humidity bias test | Sandwich structure (Al electrode) | | | | Al comb tooth electrode | Cu comb tooth electrode | Ag comb tooth electrode |
|---|---|---|---|---|---|---|---|---|---|
| | | | Initial | After 200 hours | After 500 hours | After 1,000 hours | After 1,000 hours | After 1,000 hours | After 1,000 hours |
| Example 44 | B-1B | Alumina | $2.3 \times 10^7$ | $2.2 \times 10^7$ | $2.2 \times 10^7$ | $2.1 \times 10^7$ | $7.5 \times 10^{10}$ | $4.1 \times 10^9$ | $4.5 \times 10^{10}$ |
| Example 45 | B-2B | Alumina | $2.4 \times 10^7$ | $2.4 \times 10^7$ | $2.4 \times 10^7$ | $2.3 \times 10^7$ | $7.8 \times 10^{10}$ | $4.2 \times 10^9$ | $4.8 \times 10^{10}$ |
| Example 46 | B-14B | Alumina | $6.4 \times 10^6$ | $6.1 \times 10^6$ | $5.8 \times 10^6$ | $5.4 \times 10^6$ | $2.1 \times 10^{10}$ | $1.2 \times 10^9$ | $1.8 \times 10^{10}$ |
| Example 47 | B-18 | Alumina | $2.1 \times 10^7$ | $2.0 \times 10^7$ | $2.0 \times 10^7$ | $1.9 \times 10^7$ | $7.1 \times 10^{10}$ | $3.8 \times 10^9$ | $3.1 \times 10^{10}$ |
| Example 48 | B-19 | Alumina | $2.2 \times 10^7$ | $2.1 \times 10^7$ | $2.1 \times 10^7$ | $2.0 \times 10^7$ | $7.2 \times 10^{10}$ | $4.0 \times 10^9$ | $3.9 \times 10^{10}$ |
| Example 49 | B-31 | Alumina | $5.9 \times 10^6$ | $5.5 \times 10^6$ | $5.1 \times 10^6$ | $4.9 \times 10^6$ | $9.1 \times 10^{10}$ | $8.7 \times 10^9$ | $7.6 \times 10^{10}$ |

TABLE 8

Composition of past composition

| | Name of paste composition | Inorganic particles | | Compound A | | | Silane coupling agent | | Organic solvent | | Resin | |
|---|---|---|---|---|---|---|---|---|---|---|---|---|
| | | Material | Parts by weight | Material | Parts by weight | Material | Material | Parts by weight | Material | Parts by weight | Material | Parts by weight |
| Example 50 | B-50 | BT02 | 100 | HOA-MPE | 3 | — | KBM503 | 1 | THFA | 35 | Resin solution A | 27 |
| Example 51 | B-51 | BT02 | 100 | HOA-MPE | 3 | — | KBM503 | 1 | γ-BL | 35 | Resin solution A | 27 |
| Example 52 | B-52 | BT02 | 100 | HOA-MPE | 3 | — | KBM503 | 1 | Ethyl lactate | 35 | Resin solution A | 27 |
| Example 53 | B-53 | ST-03 | 100 | HOA-MPE | 3 | — | KBM503 | 1 | THFA | 35 | Resin solution A | 27 |
| Example 54 | B-54 | BT02 | 100 | HOA-MPE | 3 | — | KBM503 | 1 | THFA | 35 | Resin solution A-2 | 27 |

TABLE 9

Paste composition

| | Dispersion conditions | | | Filling rate of inorganic particles (% by weight) | Average particle diameter of inorganic particles in paste composition (nm) |
|---|---|---|---|---|---|
| | Dispersion technique | Diameter of beads | Time | | |
| Example 50 | Ball mill | φ0.4 mm | 6 hours + 24 hours | 84.4 | 215 |
| Example 51 | Ball mill | φ0.4 mm | 6 hours + 24 hours | 84.4 | 254 |
| Example 52 | Ball mill | φ0.4 mm | 6 hours + 24 hours | 84.4 | 248 |
| Example 53 | Ball mill | φ0.4 mm | 6 hours + 24 hours | 84.4 | 480 |
| Example 54 | Ball mill | φ0.4 mm | 6 hours + 24 hours | 84.4 | 232 |

TABLE 10

Evaluation results of dielectric composition

Resistance value in high-temperature high-humidity bias test (Ω)

| | Name of paste composition | Dielectric constant (Relative dielectric constant) | Developable L/S (μm) | Substrate in high-temperature high-humidity bias test | Sandwich structure (Al electrode) | | | | Al comb tooth electrode | Cu comb tooth electrode | Ag comb tooth electrode |
|---|---|---|---|---|---|---|---|---|---|---|---|
| | | | | | Initial | After 200 hours | After 500 hours | After 1,000 hours | After 1,000 hours | After 1,000 hours | After 1,000 hours |
| Example 50 | B-50 | 44 | 10/10 | Aluminum | $2.3 \times 10^7$ | $2.2 \times 10^7$ | $2.1 \times 10^7$ | $2.1 \times 10^7$ | $4.5 \times 10^{10}$ | $2.3 \times 10^9$ | $2.0 \times 10^{10}$ |
| Example 51 | B-51 | 43 | 20/20 | Aluminum | $2.5 \times 10^6$ | $2.4 \times 10^6$ | $2.4 \times 10^6$ | $2.3 \times 10^6$ | $7.7 \times 10^9$ | $5.2 \times 10^8$ | $4.9 \times 10^9$ |

TABLE 10-continued

| | | | | Evaluation results of dielectric composition | | | | | | |
|---|---|---|---|---|---|---|---|---|---|---|
| | | | Substrate | Resistance value in high-temperature high-humidity bias test ($\Omega$) | | | | | | |
| | | Dielectric constant | in high-temperature | Sandwich structure (Al electrode) | | | | Al comb tooth electrode | Cu comb tooth electrode | Ag comb tooth electrode |
| Name of paste composition | (Relative dielectric constant) | Developable L/S (μm) | high-humidity bias test | Initial | After 200 hours | After 500 hours | After 1,000 hours | After 1,000 hours | After 1,000 hours | After 1,000 hours |
| Example 52 | B-52 | 43 | 20/20 | Aluminum | $1.8 \times 10^6$ | $1.7 \times 10^6$ | $1.6 \times 10^6$ | $1.6 \times 10^6$ | $7.1 \times 10^9$ | $4.6 \times 10^8$ | $4.2 \times 10^9$ |
| Example 53 | B-53 | 18 | 30/30 | Aluminum | $1.0 \times 10^7$ | $9.8 \times 10^6$ | $9.7 \times 10^6$ | $9.5 \times 10^6$ | $1.3 \times 10^9$ | $3.6 \times 10^8$ | $9.6 \times 10^8$ |
| Example 54 | B-54 | 43 | 25/25 | Aluminum | $1.8 \times 10^7$ | $1.7 \times 10^7$ | $1.7 \times 10^7$ | $1.7 \times 10^7$ | $3.9 \times 10^{10}$ | $2.2 \times 10^9$ | $3.4 \times 10^{10}$ |

TABLE 11

| | Composition of past composition | | | | | | | |
|---|---|---|---|---|---|---|---|---|
| | Name of paste composition | Inorganic particles | | Dispersing agent | | Organic solvent | | Resin |
| | | Material | Parts by weight | Material | Parts by weight | Material | Parts by weight | Material | Parts by weight |
| Comparative Example 1 | C-1B | BT02 | 100 | BYK-W9010 | 5 | Ethyl lactate | 35 | Resin solution A | 27 |
| Comparative Example 2 | C-2 | BT02 | 100 | BYK-W9010 | 5 | Ethyl lactate | 35 | Resin solution A | 27 |

TABLE 12

| | Paste composition | | | | |
|---|---|---|---|---|---|
| | Dispersion conditions | | | Filling rate of inorganic particles (% by weight) | Average particle diameter of inorganic particles in paste composition (nm) |
| | Dispersion technique | Diameter of beads | Time | | |
| Comparative Example 1 | Beads mill | φ0.05 mm | 2 hours | 83.7 | 213 |
| Comparative Example 2 | Ball mill | φ0.4 mm | 24 hours | 83.7 | 226 |

TABLE 13

| | | | | Evaluation results of dielectric composition | | | | | | |
|---|---|---|---|---|---|---|---|---|---|---|
| | | | | Resistance value in high-temperature high-humidity bias test ($\Omega$) | | | | | | |
| | Dielectric constant | | Substrate in high-temperature high-humidity bias test | Sandwich structure (Al electrode) | | | | Al comb tooth electrode | Cu comb tooth electrode | Ag comb tooth electrode |
| | (Relative dielectric constant) | Developable L/S (μm) | | Initial | After 200 hours | After 500 hours | After 1,000 hours | After 1,000 hours | After 1,000 hours | After 1,000 hours |
| Comparative Example 1 | 32 | 15/15 | Aluminum | $4.5 \times 10^5$ | 0 | 0 | 0 | Failure 1 hour | Failure 1 hour | Failure 0.5 hour |
| Comparative Example 2 | 41 | 15/15 | Aluminum | $2.3 \times 10^5$ | 0 | 0 | 0 | Failure 1 hour | Failure 1 hour | Failure 0.5 hour |

There is no particular limitation on applications of a paste composition and a dielectric composition according to aspects of the present invention. For example, the paste composition and the dielectric composition are used, as a high dielectric constant layer for an interlayer insulating film for an embedded capacitor of a printed circuit board, and also can be applied to various electronic components and devices, such as an interlayer insulating film of a multi-layered substrate, a frequency filter, a radio antenna and an electromagnetic shield.

The invention claimed is:

1. A high dielectric constant paste composition comprising:
   (A) inorganic particles having a perovskite crystal structure or a complex perovskite crystal structure,
   (B) a compound represented by any one of the general formulas (1) to (4), and
   (C) an organic solvent;

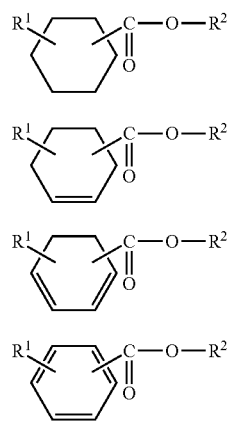

wherein in the general formulas (1) to (4), $R^1$ represents a monovalent group having a polymerizable group, $R^2$ represents a hydrogen atom or a monovalent group represented by the general formula (5) shown below; and

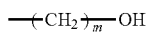

wherein in the general formula (5), m is an integer of 1 to 3.

2. The high dielectric constant paste composition according to claim 1, wherein $R^1$ in the general formulas (1) to (4) is a monovalent group represented by the general formula (6):

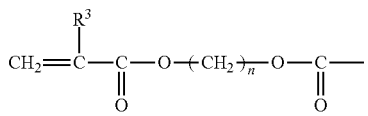

wherein $R^3$ represents a hydrogen atom or methyl group, and n is an integer of 1 to 3.

3. The high dielectric constant paste composition according to claim 2, wherein the compound (B) is a compound represented by the general formula (4), and $R^2$ is a hydrogen atom, $R^1$ is a group represented by the general formula (6), and n is 2.

4. The high dielectric constant paste composition according to claim 1, further comprising a resin.

5. The high dielectric constant paste composition according to claim 4, wherein the resin is at least one of polyimide and a polyimide precursor.

6. A dielectric composition obtained by curing the paste composition according to claim 1.

7. A capacitor comprising the dielectric composition according to claim 6.

8. The high dielectric constant paste composition according to claim 1, wherein $R^1$ in the general formulas (1) to (4) is selected from the group consisting of a vinyl group, an acrylate group, a methacrylate group, an epoxy acrylate group, an epoxy methacrylate group and an epoxy group.

9. The high dielectric constant paste composition according to claim 1 further comprising a polymerization promoter selected from the group consisting of an oxime compound, a benzophenone compound, a triazine compound, a benzotriazole compound, a phosphonium compound, a sulfonium compound, and an iodonium compound.

10. The high dielectric constant paste composition according to claim 1, wherein the inorganic particles have a dielectric constant of 50 to 30,000.

11. The high dielectric constant paste composition according to claim 1, wherein the inorganic particles are selected from the group consisting of barium titanate-based, barium titanate zirconate-based, strontium titanate-based, calcium titanate-based, bismuth titanate-based, magnesium titanate-based, barium neodymium titanate-based, barium stannate titanate-based, barium magnesium niobate-based, barium magnesium tantalate -based, lead titanate-based, lead zirconate, lead zirconate titanate, lead niobate-based, lead magnesium niobate-based, lead nickel niobate-based, lead tungstate-based, calcium tungstate-based, lead magnesium tungstate-based, and titanium dioxide-based inorganic particles.

12. The high dielectric constant paste composition according to claim 1, wherein the organic solvent is tetrahydrofurfuryl alcohol.

13. The high dielectric constant paste composition according to claim 1 further comprising a silane coupling agent.

14. The high dielectric constant paste composition according to claim 1 further comprising at least one additional constituent selected from the group consisting of dispersing agents, pH adjustors, surfactants, humectants, polymerization promoters, polymerization inhibitors, plasticizers, and antioxidants.

* * * * *